United States Patent
Oh et al.

(10) Patent No.: US 8,214,717 B2
(45) Date of Patent: Jul. 3, 2012

(54) APPARATUS AND METHOD FOR DECODING LDPC CODE BASED ON PROTOTYPE PARITY CHECK MATRIXES

(75) Inventors: Jong-Ee Oh, Daejon (KR); Chanho Yoon, Daejon (KR); Cheol-Hui Ryu, Daejon (KR); Eun-Young Choi, Daejon (KR); Sok-Kyu Lee, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 1033 days.

(21) Appl. No.: 12/166,866

(22) Filed: Jul. 2, 2008

(65) Prior Publication Data

US 2009/0158121 A1    Jun. 18, 2009

(30) Foreign Application Priority Data

Dec. 14, 2007   (KR) .................. 10-2007-0131487

(51) Int. Cl.
*H03M 13/00* (2006.01)

(52) U.S. Cl. .................. 714/759; 714/794; 714/800

(58) Field of Classification Search .................. 714/759, 714/800, 807, 801, 752, 780, 794
See application file for complete search history.

(56) References Cited

U.S. PATENT DOCUMENTS 7,178,080 B2 * 2/2007 Hocevar ................. 714/752
7,458,009 B2 * 11/2008 Yu et al. ................. 714/800
7,669,109 B2 * 2/2010 Hocevar ................. 714/780

FOREIGN PATENT DOCUMENTS

KR  10-2007-0025522 A   3/2007
KR  10-2007-0073949 A   7/2007

OTHER PUBLICATIONS

Torben Brack et. al. "A Synthesizable IP Core for WIMAX 802. 16E LDPC Code Decoding" IEEE 17th PIMRC, pp. 1-5, Sep. 11-14, 2006.
Blanksby et al., "A 690-mW 1-Gb/s 1024-6, Rate 1/2 Low Density Parity-Check Code Decoder", Mar. 2002, pp. 404-412, vol. 37, No. 3, IEEE Journal of Solid-State Circuits.
Robert G. Gallager, "Low-Density parity-check codes", Jul. 1963, pp. 1-90.
Marc P. C. Fossorier, "Quasi-Cyclic Low-Density Parity-Check Codes From Circulant Permutation Matrices", Aug. 2004, pp. 1788-1793, vol. 50, No. 8, IEEE Transactions on Information Theory.

* cited by examiner

*Primary Examiner* — Fritz Alphonse
(74) *Attorney, Agent, or Firm* — Kile Park Goekjian Reed & McManus PLLC

(57) ABSTRACT

Provided is an apparatus and method for decoding a Low Density Parity Check (LDPC) code based on prototype parity check matrixes. The apparatus, includes: a parity check matrix selecting means for determining multiple prototype parity check matrixes according to a sub-matrix size and a parallelization figure for processing the parity check matrix; a bit input means for receiving a log likelihood probability value for input bit according to the sub-matrix size and the parallelization figure; a check matrix process means for sequentially performing a partial parallel process on the parity check matrix based on the received log likelihood probability value and the determined multiple prototype parity check matrixes; and a bit process means for determining a bit level based on the partial-parallel processed parity check matrix value and recovering the input bit according to the sub-matrix size and the parallelization figure.

16 Claims, 22 Drawing Sheets

FIG. 1

|   | 0 | 1 | 2 | 3 | 4 | 5 |
|---|---|---|---|---|---|---|
| 0 | 4 | 0 | 1 | 2 | 3 | 3 |
| 1 | 1 | 2 | 3 | 1 | 4 | 0 |
| 2 | 3 | 4 | 0 | 4 | 1 | 2 |

~101 (indicates cell at row 0, column 5)

Variable node update

FIG. 3

|   | 0 | 1 | 2 | 3 | 4 | 5 | 6 | 7 |
|---|---|---|---|---|---|---|---|---|
| 0 | 6 | - | 4 | 5 | 0 | 0 | - | - |
| 1 | 2 | 3 | - | 6 |   | 1 | 1 | - | ~302
| 2 | - | 5 | 3 | 4 | 2 | - | 2 | 2 | ~301
| 3 | 1 | 2 | 5 | - | 3 | - | - | 3 |

FIG. 5

| | 0 | 1 | 2 | 3 | 4 | 5 | 6 | 7 | 8 | 9 | 10 | 11 |
|---|---|---|---|---|---|---|---|---|---|---|---|---|
| 0 | - | - | - | 13 | - | 7 | - | 18 | 9 | 1 | - | 33 |
| 1 | 37 | 30 | 7 | - | - | 20 | - | 21 | - | - | - | 33 |
| 2 | 26 | - | 29 | - | 35 | - | 28 | - | 22 | - | 34 | - |
| 3 | - | 28 | - | 3 | 7 | - | 16 | - | 15 | 21 | - |
| 4 | - | - | 22 | - | - | 29 | - | 15 | - | - |
| 5 | - | 18 | - | - | - | 26 | - | - | 2 | - |
| 6 | - | - | 3 | - | - | 0 | - | - | - | 15 |
| 7 | 24 | - | - | - | 34 | - | 35 | - | - | - |
| 8 | - | - | 10 | - | 31 | - | - | - | 25 | - |
| 9 | 34 | - | - | 6 | - | - | 33 | - | - | - |
| 10 | - | 10 | - | 6 | - | - | - | 20 | - | - |
| 11 | - | - | 33 | - | 30 | - | - | - | 18 | - |
| 12 | 0 | - | - | - | - | 6 | - | - | - | 11 |
| 13 | 0 | 1 | - | - | - | - | - | - | - | - |
| 14 | - | 1 | 2 | - | - | - | - | - | - | - |
| 15 | - | - | 2 | 3 | - | - | - | - | - | - |
| 16 | - | - | - | 3 | 4 | - | - | - | - | - |
| 17 | - | - | - | - | 4 | 5 | - | - | - | - |
| 18 | - | - | - | - | - | 5 | 6 | - | - | - |
| 19 | - | - | - | - | - | - | 6 | 7 | - | - |
| 20 | - | - | - | - | - | - | - | 7 | 8 | - |
| 21 | - | - | - | - | - | - | - | - | 8 | 9 |
| 22 | - | - | - | - | - | - | - | - | - | 9 | 10 | - |
| 23 | - | - | - | - | - | - | - | - | - | - | 10 | 11 |

FIG. 6

| | 0 | 1 | 2 | 3 | 4 | 5 | 6 | 7 | 8 | 9 | 10 | 11 |
|---|---|---|---|---|---|---|---|---|---|---|---|---|
| 0 | 0 | - | 13 | - | 7 | - | 18 | 9 | 1 | - | 33 | - |
| 1 | 18 | 11 | 7 | - | - | 1 | - | 2 | - | - | - | 14 |
| 2 | 7 | - | 10 | - | 16 | - | 9 | - | 3 | - | 15 | - |
| 3 | - | 28 | - | 3 | 7 | - | 16 | - | - | 15 | 21 | - |
| 4 | - | - | - | - | - | - | 10 | - | - | 15 | - | - |
| 5 | - | 18 | - | - | - | - | - | 7 | - | - | 2 | - |
| 6 | - | - | 3 | - | - | - | - | 0 | - | - | 15 |
| 7 | 5 | - | - | - | - | 15 | 16 | - | - |
| 8 | - | - | 10 | - | 12 | - | - | - | 6 | - |
| 9 | 15 | - | - | - | 6 | - | - | - | 10 | - | - | - |
| 10 | - | 10 | - | - | 6 | - | - | - | - | 1 | - | - |
| 11 | - | - | 14 | - | 11 | - | - | - | - | - | 18 | - |
| 12 | 0 | - | - | - | - | 6 | - | - | - | - | - | 11 |
| 13 | 0 | 1 | - | - | - | - | - | - | - | - | - | - |
| 14 | - | 1 | 2 | - | - | - | - | - | - | - | - | - |
| 15 | - | - | 2 | 3 | - | - | - | - | - | - | - | - |
| 16 | - | - | 3 | 4 | - | - | - | - | - | - | - | - |
| 17 | - | - | - | 4 | 5 | - | - | - | - | - | - | - |
| 18 | - | - | - | - | 5 | 6 | - | - | - | - | - | - |
| 19 | - | - | - | - | - | 6 | 7 | - | - | - | - | - |
| 20 | - | - | - | - | - | - | 7 | 8 | - | - | - | - |
| 21 | - | - | - | - | - | - | - | 8 | 9 | - | - | - |
| 22 | - | - | - | - | - | - | - | - | 9 | 10 | - | - |
| 23 | - | - | - | - | - | - | - | - | - | 10 | 10 | 11 |

APPARATUS AND METHOD FOR DECODING LDPC CODE BASED ON PROTOTYPE PARITY CHECK MATRIXES

CROSS-REFERENCE TO RELATED APPLICATIONS

The present invention claims priority of Korean Patent Application No. 10-2007-0131487, filed on Dec. 14, 2007, which is incorporated herein by reference.

BACKGROUND OF THE INVENTION

1. Field of the Invention

The present invention relates to an apparatus and method for decoding a Low Density Parity Check (LDPC) code based on prototype parity check matrixes; and, more particularly, to an apparatus and method for decoding a LDPC code based on prototype parity check matrixes which performs decoding at high-speed while reducing complexity by sequentially performing a partial parallel process on the parity check matrix based on multiple prototype parity check matrixes determined according to a parallelization figure in decoding an input bit based on the parity check matrix, to thereby support the length and the bit rate of diverse code words.

This work was supported by the IT R&D program for MIC/IITA [2006-S-002-02, "IMT-Advanced Radio Transmission Technology with Low Mobility"].

2. Description of Related Art

A transmitted signal on a wired/wireless communication system passes through noise, interference and fading on transmission channel. Accordingly, a case that a receiver cannot demodulate the transmitted signal occurs.

An error correction code technique is a representative technique among diverse techniques for reducing error rates which increases due to a fast transmitted speed on the wired/wireless communication system. Recently, the error correction code is applied to most wireless communication systems. In particular, a Low Density Parity Check (LDPC) code of the error correction codes has superior error correction performance and can realize a high-speed decoder at low complexity. Therefore, the LDPC code is the limelight of the error correction code for a next generation high-capacity wireless communication system.

The LDPC code is introduced by "Gallager". The LDPC code is defined as a parity check matrix where the minimum number of elements has a value '1' and most elements have a value '0'.

The LDPC code is divided into a regular LDPC code and an irregular LDPC code. The regular LDPC code is an LDPC code suggested by "Gallager" where all rows in the parity check matrix have values '1' of the same number as an element and all columns have values '1' of the same number as an element. Differently from this, in the parity check matrix of the irregular LDPC code, there are rows including values '1' of different numbers or columns including values '1' of different numbers. It is known that the irregular LDPC code is superior to the regular LDPC code in an error correcting function.

"Fossorier" suggests a Quasi-cyclic LDPC code showing the element of the parity check matrix as a cyclic shifted identity matrix and '0 matrix', not as the elements '0' and '1' on matrix.

Meanwhile, there are a decoding method using a serial or partial parallel processing method and a decoding method using a parallel processing method as a decoding method using the LDPC code.

The serial or partial parallel processing method has a merit that a hardware size for driving is reduced by repeatedly using a few public variable node process blocks and public check node process blocks. However, the serial or partial parallel processing method has a shortcoming that high-speed decoding cannot be supported.

On the other hand, the parallel processing method can support high-speed decoding by performing parallel information exchange by equipping the variable node process block and the check node process block optimized to each parity check matrix. However, the parallel processing method has a shortcoming that the hardware size for driving is large and the hardware size increases as diverse code rates are supported.

Meanwhile, in order to apply Modulation and Coding Scheme (MCS) which is adaptive to the channel status, the wired/wireless communication system is required to use the error correction code having a variable information length and a variable code rate. Accordingly, the conventional decoding methods for supporting diverse and adaptive modulation and coding levels include a method for individually realizing an optimized decoder according to each information length and protection rate and a method for applying information shortening technique or punching technique while using one hardware.

The method for individually realizing the optimized decoder has a shortcoming that the hardware size increases. On the other hand, the information shortening technique or punching technique has a problem that the error correction performance of the LDPC code may be deteriorated by randomly applying the information shortening technique or the parity punching technique.

As described above, the decoding method of the parallel processing method is advantageous to a super high-speed wireless communication system requiring a process speed of several-giga class. Also, In order to efficiently apply the adaptive modulation and coding technique which is popular in the super high-speed wireless communication system, the LDPC code of the variable information length and variable protection rate having superior error correction performance is required. Also, the decoding complexity of the LDPC code should be low.

However, the decoding method of the conventional parallel processing method has a problem that a process time is delayed by increase of calculation quantity and complexity due to random and complex connection between the variable node and the check node. In particular, there is a problem that it is difficult to adaptively correspond to the change of the length and the bit rate of the code word since the calculation quantity and the complexity increases to support the diverse code word lengths and the diverse bit rates in the decoding method of the conventional parallel processing method.

SUMMARY OF THE INVENTION

An object of the present invention is to solve the problem that the conventional technology cannot adaptively correspond to the change of the length and the bit rate of the code word due to additional increase of the calculation quantity and the complexity for supporting the diverse code word lengths and the diverse bit rates.

An embodiment of the present invention is directed to providing an apparatus and method for decoding a Low Density Parity Check (LDPC) code based on prototype parity check matrixes which performs decoding at high-speed while reducing complexity by sequentially performing a partial parallel process on the parity check matrix according to multiple prototype parity check matrixes determined based on a parallelization figure in decoding an input bit based on the parity check matrix, to thereby support the length and the bit rate of diverse code words.

The objects of the present invention are not limited to the above-mentioned ones. Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In order to solve the above problem, the present invention sequentially performs the partial parallel process on the parity check matrix according to the multiple prototype parity check matrixes determined based on the parallelization figure in decoding the input bit based on the parity check matrix.

In accordance with an aspect of the present invention, there is provided an apparatus for decoding a Low Density Parity Check (LDPC) code, including: a parity check matrix selecting means for determining multiple prototype parity check matrixes according to a sub-matrix size and a parallelization figure for processing the parity check matrix; a bit input means for receiving a log likelihood probability value for input bit according to the sub-matrix size and the parallelization figure; a check matrix process means for sequentially performing a partial parallel process on the parity check matrix based on the received log likelihood probability value and the determined multiple prototype parity check matrixes; and a bit process means for determining a bit level based on the partial-parallel processed parity check matrix value and recovering the input bit according to the sub-matrix size and the parallelization figure.

In accordance with another aspect of the present invention, there is provided a method for decoding an LDPC code, including: determining multiple prototype parity check matrixes according to a sub-matrix size and a parallelization figure for processing a parity check matrix; receiving a log likelihood probability value on an input bit according to the sub-matrix size and the parallelization figure; sequentially performing a partial parallel process on the parity check matrix based on the received log likelihood probability value and the determined multiple prototype parity check matrixes; and recovering the input bit according to the sub-matrix size and the parallelization figure by determining a bit level based on the partial-parallel-processed parity check matrix value.

BRIEF DESCRIPTION OF THE DRAWINGS

FIG. 1 shows a parity check matrix of a Quasi-Cyclic Low Density Parity Check (QC-LDPC) code.

FIG. 3 shows the parity check matrix of a non-uniform QC-LDPC code in accordance with an embodiment of the present invention.

FIG. 5 shows the parity check matrix of the non-uniform QC-LDPC code in accordance with another embodiment of the present invention.

FIG. 6 shows the parity check matrix of the non-uniform QC-LDPC code having a size of a sub-matrix which is different from that of the sub-matrix in FIG. 5.

DESCRIPTION OF SPECIFIC EMBODIMENTS

Figure 2A:
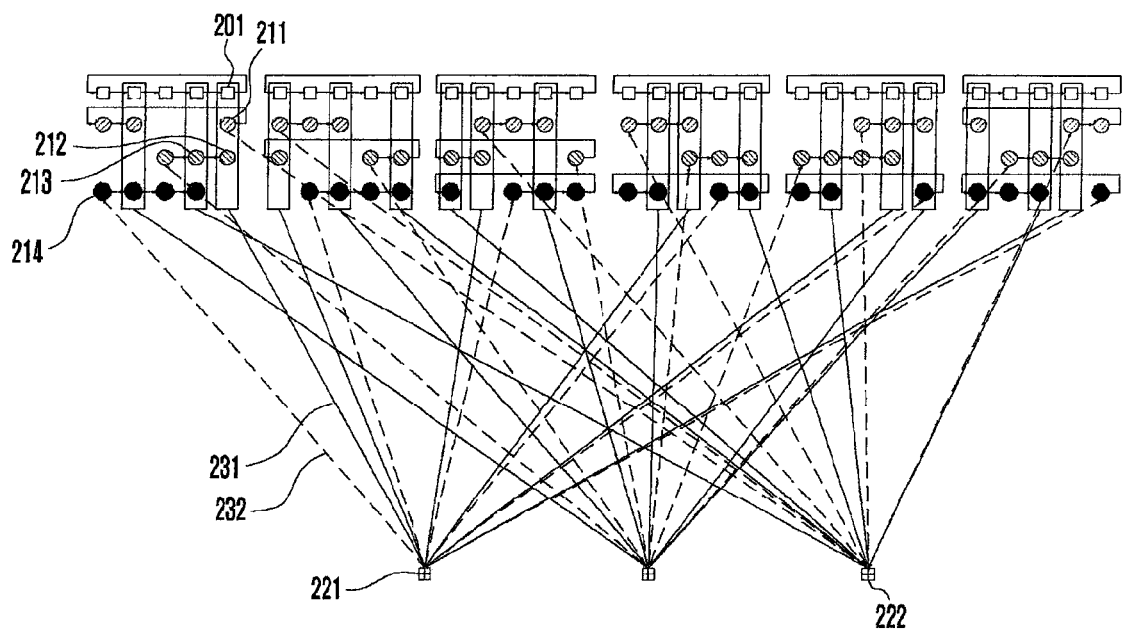
FIGS. 2A and 2B show a factor graph of the parity check matrix of FIG. 1.

The advantages, features and aspects of the invention will become apparent from the following description of the embodiments with reference to the accompanying drawings, which is set forth hereinafter. Therefore, those skilled in the field of this art of the present invention can embody the technological concept and scope of the invention easily. In addition, if it is considered that detailed description on a related art may obscure the points of the present invention, the detailed description will not be provided herein. The preferred embodiments of the present invention will be described in detail hereinafter with reference to the attached drawings.

In the embodiment below, the present invention will be described by fixing the size of the sub-matrix used in the present invention, the number of sub-matrixes, and the degree distribution of the parity check matrix. However, it may be understood by those skilled in the art that a method for modifying the length of the n×n sub-matrix, a method for modifying the number of sub-matrixes, and a method using the parity check matrix modified according to the degree distribution change of the parity check matrix are included in the scope of the present invention.

Equation 1 below is an example of a general 5×5 cyclic-permutation matrix.

$$S_0 = \begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{bmatrix}, \quad S_1 = \begin{bmatrix} 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 0 & 0 & 0 & 0 \end{bmatrix}, \quad \text{Eq. 1}$$

$$S_3 = \begin{bmatrix} 0 & 0 & 0 & 1 & 0 \\ 0 & 0 & 0 & 0 & 1 \\ 1 & 0 & 0 & 0 & 0 \\ 0 & 1 & 0 & 0 & 0 \\ 0 & 0 & 1 & 0 & 0 \end{bmatrix}$$

where $S_i$ represents a 5×5 cyclic-permutation matrix sub-matrix.

As shown in Equation 1, the sub-matrix $S_i$ shows that columns of the unit matrix are cyclic-shifted to the right as much as i.

In order to describe the present invention, a parity check matrix of a uniform LDPC code including a 5×5 sub-matrix, a non-uniform LDPC code including a 7×7 sub-matrix and a non-uniform LDPC code including a 38×38 sub-matrix will be used as an example. The sub-matrix includes the matrix acquired after n×n unit matrix is cyclic-shifted, i.e., the cyclic-permutation matrix, or an n×n "0 matrix".

FIG. 1 shows a parity check matrix of a Quasi-Cyclic Low Density Parity Check (QC-LDPC) code.

Referring to FIG. 1, in the parity check matrix of the QC-LDPC code, a square 101 shows a 5×5 unit matrix, i.e., a 5×5 sub-matrix and shows a value which is cyclic-shifted to the right. For example, the square 101 having a value "3" shows "$S_3$" shown in Equation 1.

Therefore, in the parity check matrix of the QC-LDPC code shown in FIG. 1, the 5×5 sub-matrix includes 3 rows and 6 columns. That is, the parity check matrix of the QC-LDPC code includes 15 rows and 30 columns. The value summating "1" in each row is equally 6 and the value summating "1" in each column is equally 3.

Figure 2B:
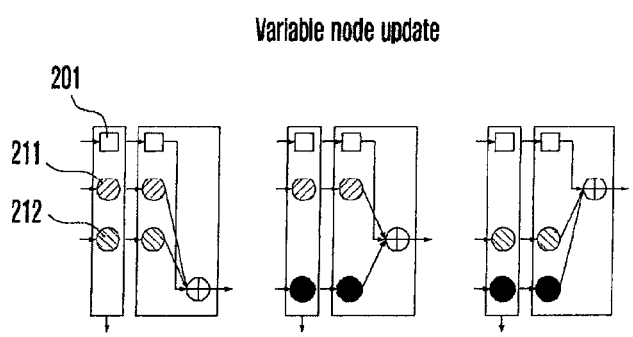

FIGS. 2A and 2B show a factor graph of the parity check matrix of FIG. 1.

In the factor graph of the parity check matrix of the QC-LDPC code shown in FIG. 1, the number of edges between the variable node and the check node is 90. However, in the factor graph of the parity check matrix applied to the present invention shown in FIG. 2A, there are 18 edges 231.

In the factor graph of the parity check matrix, the edge 231 marked as 6 full lines to transmit a variable node message is shown in each check nod. Also, an edge 232 marked as 6 dotted lines to transmit a check node message is shown in each check node. Therefore, in the factor graph of the parity check matrix in accordance with the present invention, in inverse proportion to the number of sub-matrixes, the number of the edges 231 decreases from 90 edges to 18 edges corresponding to 5 times and the number of check nodes 221 decreases from 15 to 3 corresponding to 5 times.

To have a look at a variable node process, the value of variable nodes 211 and 212 and an LLR value 201 are cyclic-shifted according to the sub-matrix for each process time. As shown in FIG. 2B, the variable node message transmitted from the variable nodes 211 and 212 to a check node 221 is calculated. That is, a variable node update procedure is performed by summating the LLR value 201 and rest values of the variable nodes 211 and 212 excluding a variable node to be acquired. For example, the variable node message is calculated by performing the operation only on the column corresponding to the values of the variable nodes 211 and 212, and the LLR value 201. The calculated variable node message is transmitted to the check node 221 through the edge 231.

Values of a neighboring variable node 213 and the check node message transmitted from a check node 222 are cyclic-shifted to the variable nodes 211 and 212. A next variable node message is calculated by performing the variable node process only on the column.

The check node message is calculated through the variable node message transmitted to the check node 221 and the calculated check node message is transmitted to a variable node 214 through the edges 232.

FIG. 3 shows the parity check matrix of the non-uniform QC-LDPC code in accordance with an embodiment of the present invention.

Referring to FIG. 3, in the parity check matrix of the non-uniform QC-LDPC code, squares 301 and 302 show a 7×7 unit matrix, i.e., a 7×7 sub-matrix, and an inside value shows a value cyclic-shifted to the right. For example, the square 301 having a value "2" shows a sub-matrix cyclic-shifted to the right as many as "2". Also, the square 302 having a value "–" shows a "0 matrix" meaning all elements are "0".

Therefore, in the parity check matrix of the non-uniform LDPC code shown in FIG. 3, the 7×7 sub-matrix includes 4 rows and 8 columns. That is, the parity check matrix of the non-uniform LDPC code includes 28 rows and 56 columns. Values acquired by summating "1" in each row are non-uniformly 5 or 6 and values acquired by summating "1" in each column are non-uniformly 2 or 3.

Figure 4A:
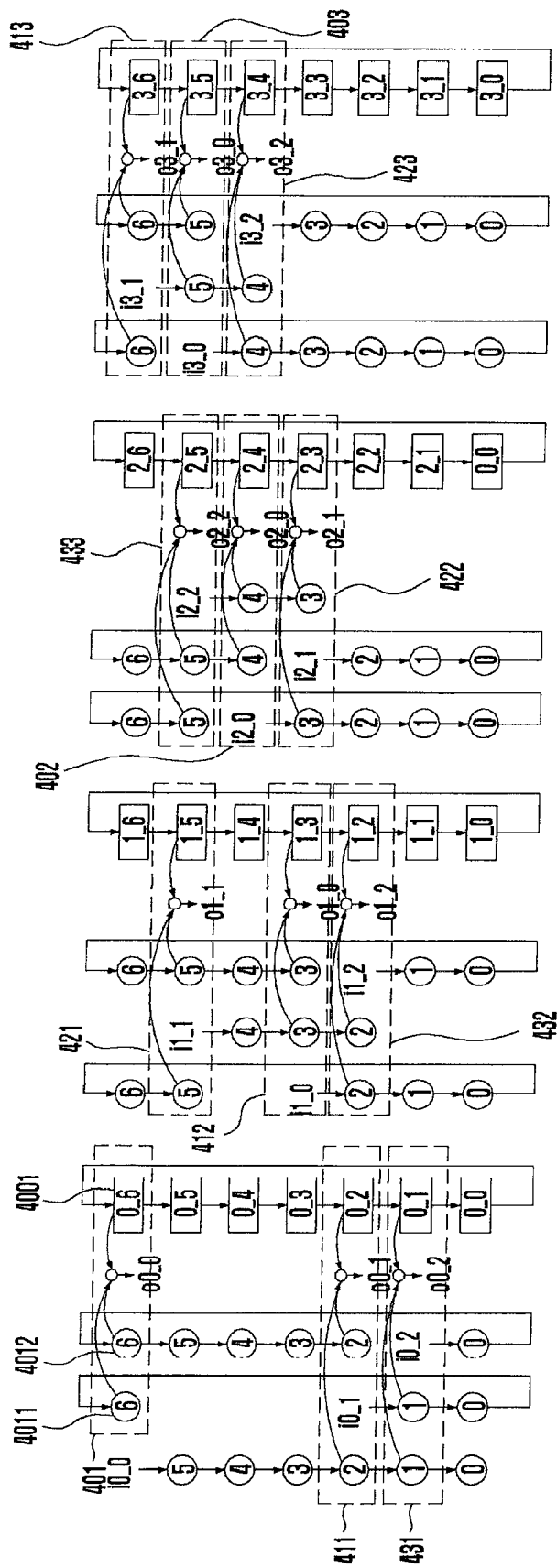
FIGS. 4A to 4C are diagrams describing a method for performing a partial parallel process on the parity check matrix based on a prototype parity check matrix in accordance with an embodiment of the present invention.
Figure 4B:
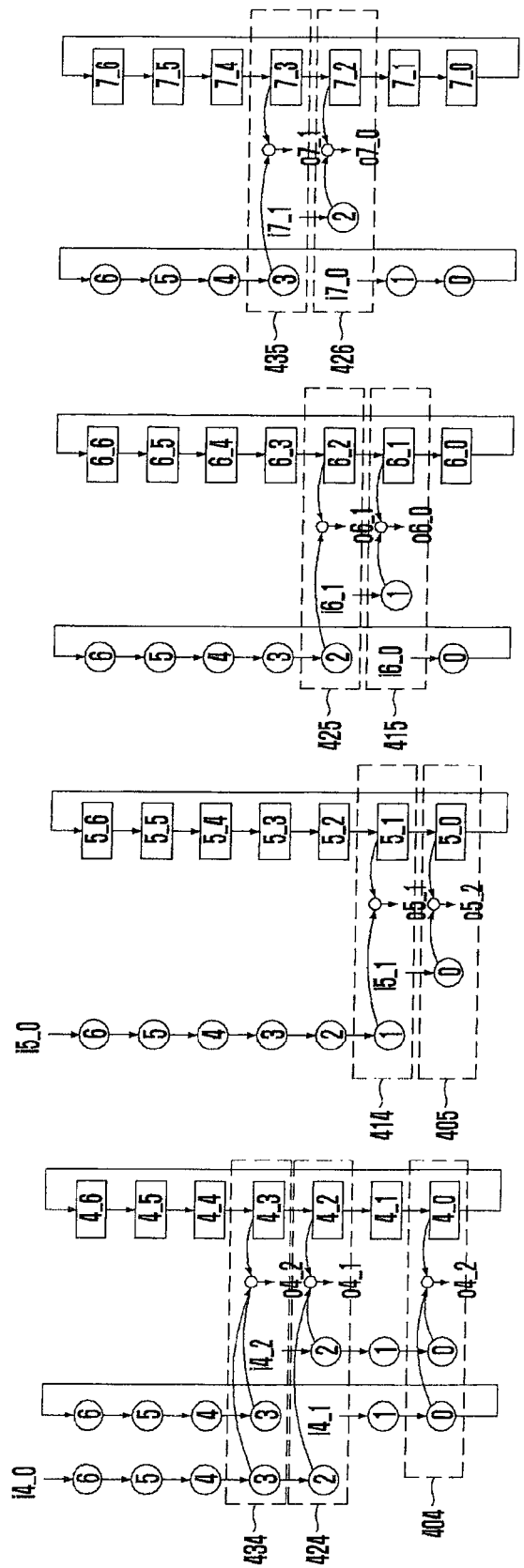
Figure 4C:
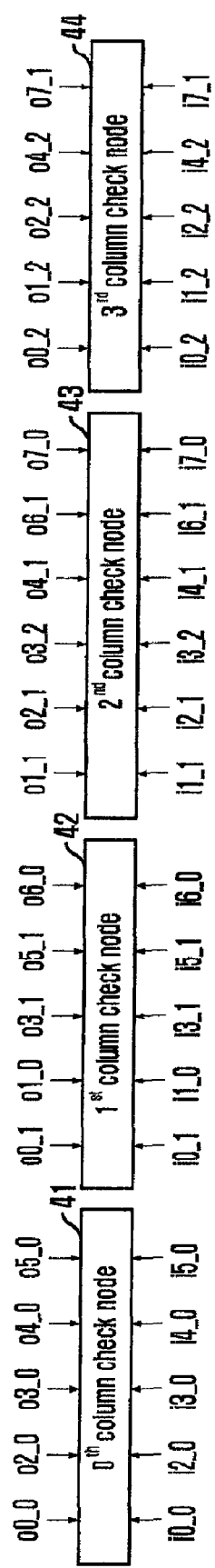

FIGS. 4A to 4C are diagrams describing a method for performing a partial parallel process on the parity check matrix based on a prototype parity check matrix in accordance with an embodiment of the present invention.

As shown in FIGS. 4A and 4B, 21 edges between the variable node and the check node are required. Here, 21 means the number of the parity check matrix sub-matrixes of FIG. 3 and direct connection between the variable node and the check node is not displayed. Each edge is required for connection between the variable node and the check node corresponding to the sub-matrix excluding "0 matrix" in the prototype parity check matrix.

The variable node messages shown in FIG. 4A, e.g., o0_0, o0_1, o0_2, o1_1, . . . , o7_1, and o7_0, are calculated by summating an LLR value 4001 and values of variable nodes 4011 and 4012 for each variable node corresponding to the prototype parity check matrix of the parity check matrix shown in FIG. 3. Subsequently, the calculated variable node message is transmitted to a $0^{th}$ column check node 41 to a $3^{rd}$ column check node 44 shown in FIG. 4C. The LLR value 4001 and the value of the variable node 4012 are cyclic-shifted according to the sub-matrix.

For example, with respect to the cyclic shift value corresponding to "6" of a $1^{st}$ column and a $1^{st}$ row of the parity check matrix, a variable node message o0_0 is calculated by summating the values of the variable nodes 4011 and 4012 and the LLR value 4001. In the same manner, through 21 variable node message operation procedures 401 to 405, 411 to 415, 421 to 426, and 431 to 435 corresponding to the sub-matrix value of the parity check matrix, the variable node messages o0_0, o0_1, o0_2, o1_1, . . . , o7_1, and o7_0 are calculated. The value of the variable node 4012 and the LLR value 4001 are cyclic-shifted according to the sub-matrix and the variable node update procedure is repeatedly performed.

Referring to FIG. 4C, the calculated variable node messages o0_0, o0_1, o0_2, o1_1, . . . , o7_1, and o7_0 are stored in the $0^{th}$ column check node 41 to the $3^{rd}$ column check node 44.

The $0^{th}$ column variable node messages o0_0, o2_0, o3_0, o4_0, and o5_0 stored in the $0^{th}$ column check node 41 are applied to the check node operation procedure and the check node messages i0_0, i2_0, i3_0, i4_0, and i5_0 are calculated.

The calculated check node messages i0_0, i2_0, i3_0, i4_0, and i5_0 are transmitted to the variable node. Subsequently, the transmitted check node messages i0_0, i2_0, i3_0, i4_0, and i5_0 are respectively stored in the variable node. In the same manner, the check node operation procedure is performed on the 1$^{st}$ column check node 42 to the 3$^{rd}$ column check node 44.

FIG. 5 shows the parity check matrix of the non-uniform QC-LDPC code in accordance with another embodiment of the present invention.

Referring to FIG. 5, in the parity check matrix of the non-uniform QC-LDPC code, the squares 501 and 502 show a 38×38 unit matrix, i.e., a 38×38 sub-matrix, and an inside value shows a value cyclic-shifted to the right. For example, the square 501 having a value "33" shows a sub-matrix cyclic-shifted to the right as many as "33". Also, the square 502 having a value "–" shows "0 matrix" where all elements are "0".

Therefore, in the parity check matrix of the non-uniform QC-LDPC code shown in FIG. 5, the 38×38 sub-matrix includes 12 rows and 24 columns. That is, the parity check matrix of the non-uniform QC-LDPC code includes 456 rows and 912 columns.

FIG. 6 shows the parity check matrix of the non-uniform QC-LDPC code having a size of a sub-matrix which is different from that of the sub-matrix in FIG. 5.

Referring to FIG. 6, in the parity check matrix of the non-uniform QC-LDPC code, squares 601 and 602 show a 19×19 unit matrix, i.e., a 19×19 sub-matrix, and an inside value is a value cyclic-shifted to the right. For example, the square 601 having a value "14" shows a sub-matrix cyclic-shifted to the right as many as "14". Also, the square 602 having a value "–" shows "0 matrix" where all elements are "0".

Therefore, in the parity check matrix of the non-uniform QC-LDPC code shown in FIG. 6, the 19×19 sub-matrix includes 12 rows and 24 columns. That is, the parity check matrix of the non-uniform QC-LDPC code includes 228 rows and 456 columns.

Meanwhile, the variable node and check node process in accordance with the present invention can be performed differently according to a case that a fast decoding speed is required and a case that low complexity is required. That is, the variable node and check node process is performed according to the parallel processing method in case where the fast decoding speed is required, and according to any one processing method of the serial processing method or the partial parallel processing method in case where low complexity is required.

For example, when the variable node and check node process on the sub-matrix having 73 edges shown in FIG. 5 is performed at a fast decoding speed, the variable node process should be performed according to the parallel processing method. The variable node process includes 4 variable node processes of an order 6, 9 variable node processes of an order 3, and 11 variable node processes of an order 2. Also, the check node process includes 11 check node processes of an order 6 and 1 check node process of an order 7.

As another example, when the variable node and check node process on 73 edges shown in FIG. 5 is performed at low complexity, the variable node process should be performed according to the entire parallel processing method. Since the process speed and complexity decrease in this case, the variable node and check node process can be usefully applied to the case that high-speed decoding is not required but low complexity is required.

Meanwhile, when first and fourth columns 51 and 52 of the parity check matrix shown in FIG. 5 are compared with first and fourth columns 61 and 62 of the parity check matrix shown in FIG. 6, a square 601 showing a value cyclic-shifted to the right where every element is not 0 in the parity check matrix shown in FIG. 6 is in the same location as the parity check matrix of FIG. 5. The cyclic-shifted value is a value of a rest acquired by dividing a value inside the square 501 of FIG. 5 by "19". For example, the sub-matrix of the parity check matrix in FIG. 6 corresponding to the sub-matrix, which is a square 503 having a value "22", is a square 603 having a value "3" corresponding to a rest acquired by dividing "22" by 19. Also, the sub-matrix of the parity check matrix in FIG. 6 corresponding to the sub-matrix, which is a square 504 having a value "29", is a square 604 having a value "10" corresponding to a rest acquired by dividing "29" by 19.

The present invention can increase or decrease the length of the code word as many as n times based on the parity check matrix shown in FIG. 6, i.e., the prototype parity check matrix where the size of the sub-matrix is modified. Also, the present invention can perform decoding based on the sub-matrix size value corresponding to the modified value, which is not a rest value acquired by division by another sub-matrix size value.

Figure 7A:
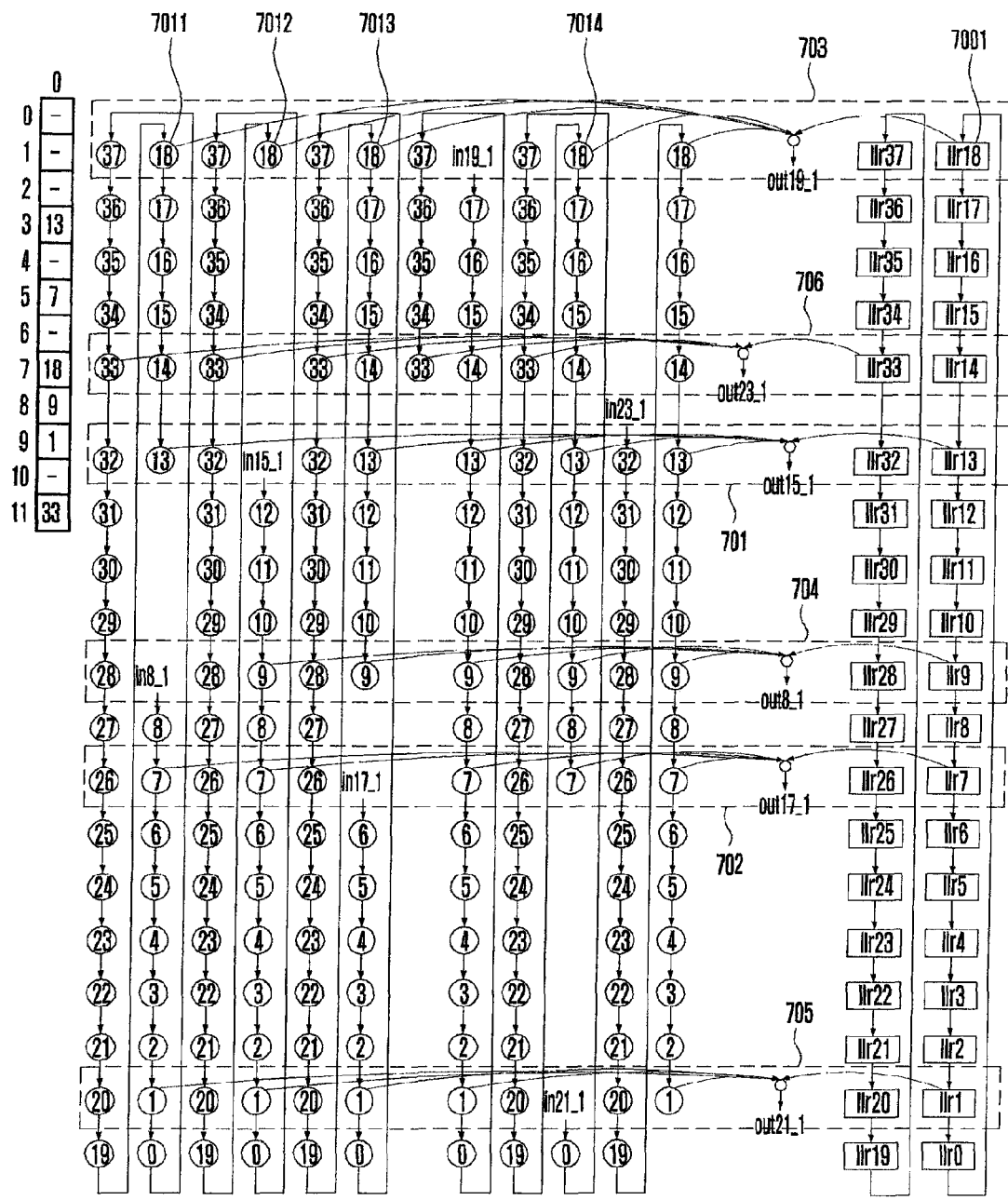
FIGS. 7A and 7B show a partial parallel process of the parity check matrix based on the prototype parity check matrix in accordance with an embodiment of the present invention.
Figure 7B:
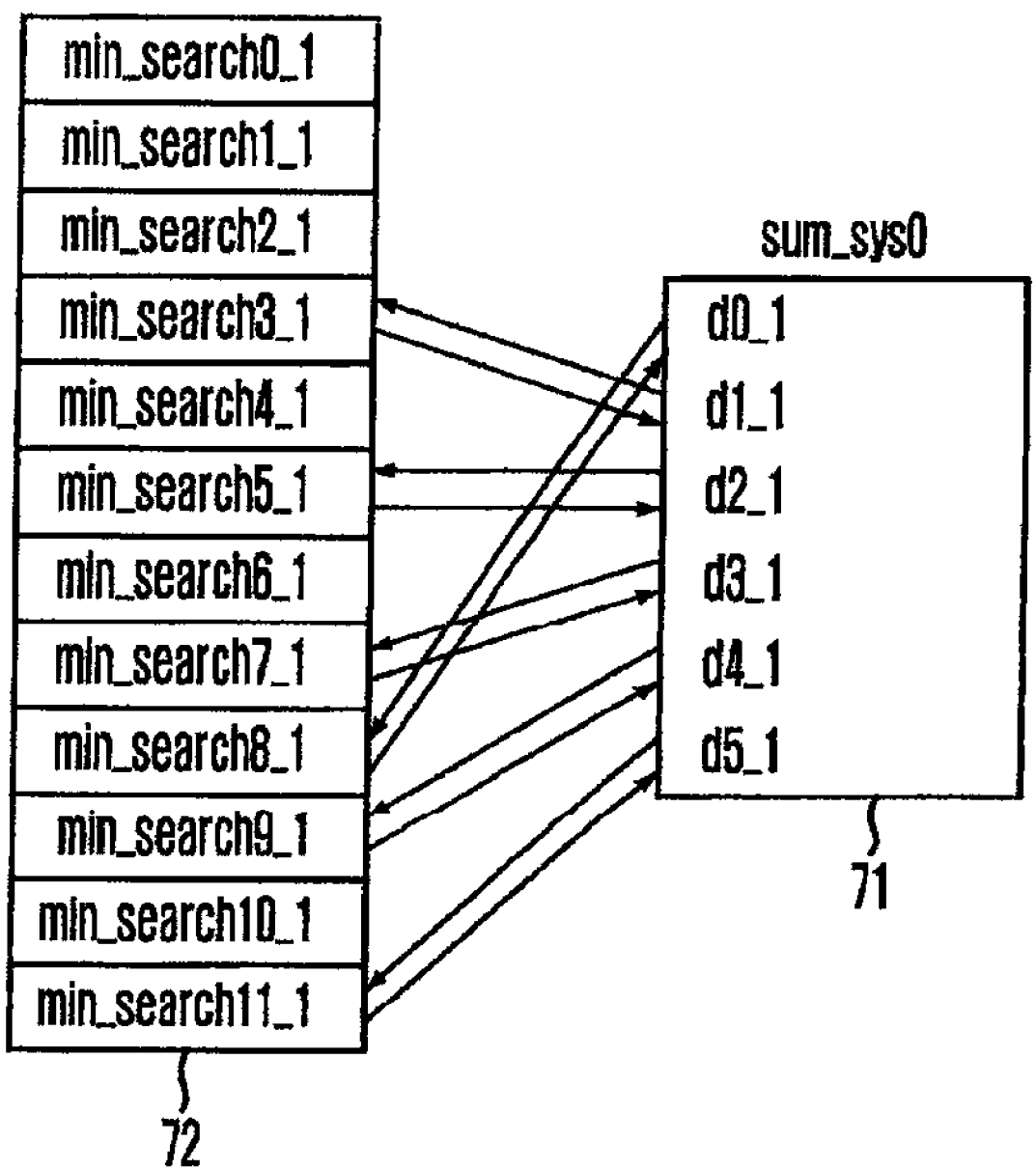

FIGS. 7A and 7B show the partial parallel process of the parity check matrix based on the prototype parity check matrix in accordance with an embodiment of the present invention.

FIGS. 7A and 7B show partial parallel processes 701 to 706 on the parity check matrix based on the prototype parity check matrix with respect to the first column 51 of the parity check matrix shown in FIG. 5. The variable node message is calculated by summating an LLR value 7001 and values of variable nodes 7011 to 7014 for each variable node corresponding to the first column 51 of the parity check matrix. The calculated variable node message is transmitted from a variable node 71 to a check node 72 shown in FIG. 7B. Subsequently, the LLR value 7001 and the values of the variable nodes 7011 to 7014 are cyclic-shifted according to each sub-matrix.

For example, a variable node message out19_1 is calculated by summating the values of the variable nodes 7011 to 7014 and the LLR value 7001 with respect to 18 times cyclic-shifted sub-matrix corresponding to the 7$^{th}$ row of the first column 51 of the parity check matrix shown in FIG. 5. In the same manner, variable node messages out19_1, out23_1, out15_2, out8_1, out17_1, and out21_1 are calculated through variable node message operation procedures 701 to 706 corresponding to each sub-matrix value of the parity check matrix. The value of the variable nodes 7011 to 7014 and the LLR value 7001 are cyclic-shifted according to each sub-matrix and the variable node update procedure is repeatedly performed.

Figure 8A:
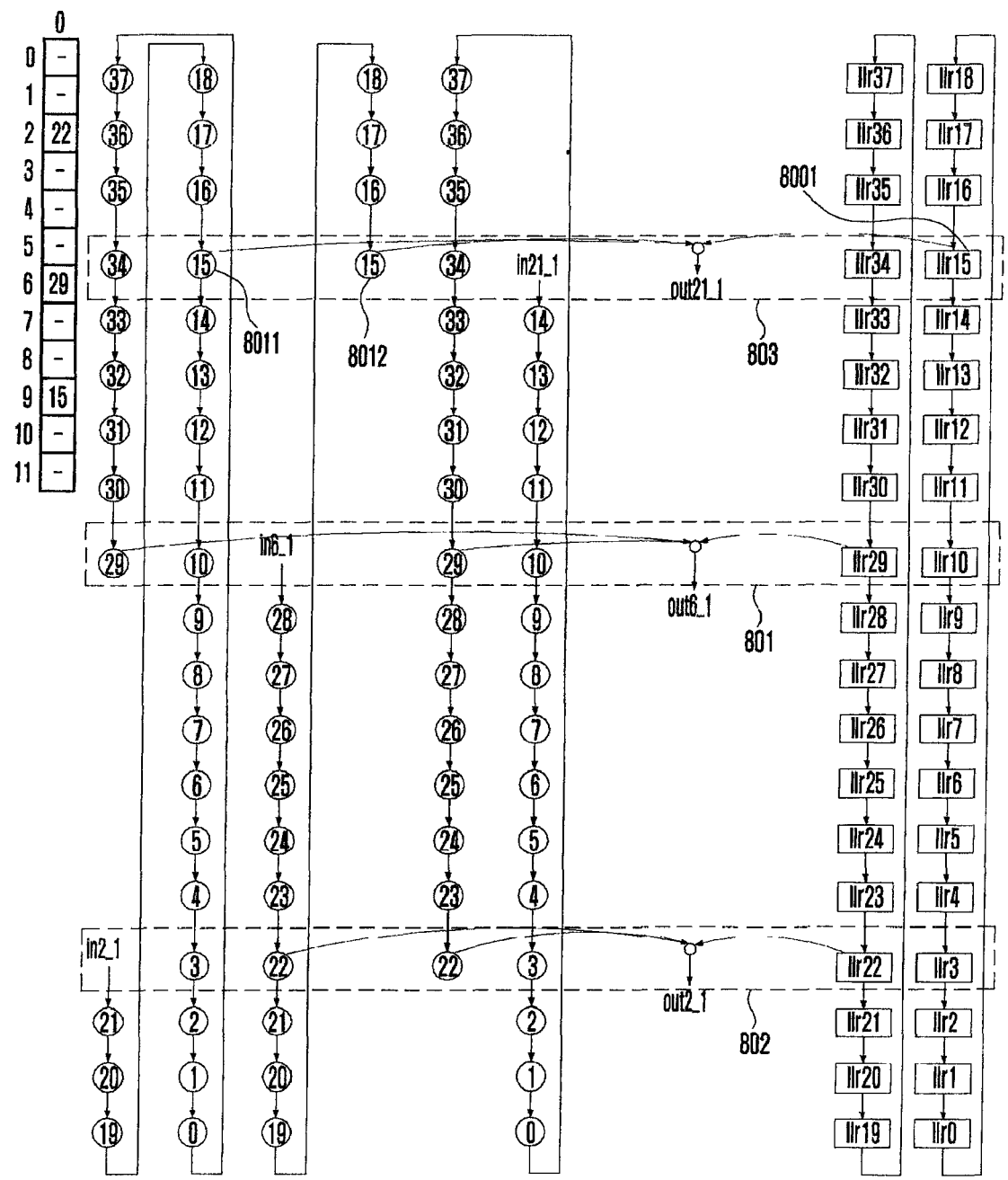
FIGS. 8A and 8B show another partial parallel process on the parity check matrix based on the prototype parity check matrix.
Figure 8B:
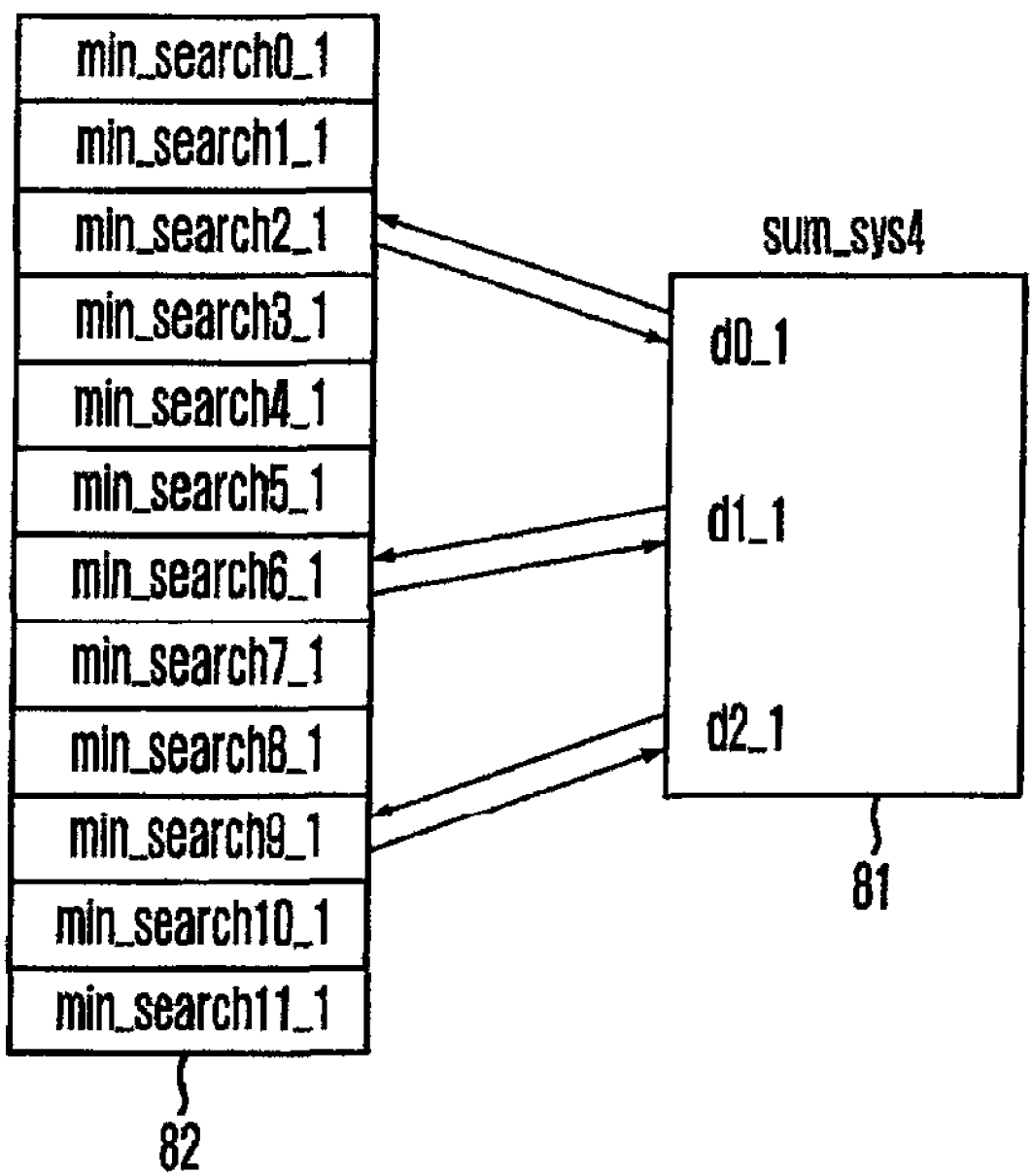

FIGS. 8A and 8B show the partial parallel process of the parity check matrix based on the prototype parity check matrix in accordance with another embodiment of the present invention.

FIGS. 8A and 8B show partial parallel processes 801 to 803 on the parity check matrix based on the prototype parity check matrix with respect to the fourth column 52 of the parity check matrix shown in FIG. 5. A variable node message is calculated by summating an LLR value 8001 and values of variable nodes 8011 and 8012 for each variable node corresponding to the fourth column 52 of the parity check matrix. The calculated variable node message is transmitted from a variable node 81 to a check node 82 shown in FIG. 8B. Subsequently, the LLR value 8001 and the values of the variable nodes 8011 to 8014 are cyclic-shifted according to each sub-matrix.

For example, a variable node message out21_1 is calculated by summating the values of the variable nodes 8011 and 8012 and the LLR value 8001 with respect to a 15-times cyclic-shifted sub-matrix corresponding to a $9^{th}$ row of the fourth column 52 of the parity check matrix shown in FIG. 5. In the same manner, variable node messages out21_1, out6_1, and out2_1 are calculated through variable node message operation procedures 801 to 803 corresponding to each sub-matrix value of the parity check matrix. The values of the variable nodes 8011 and 8012 and the LLR value 8001 are cyclic-shifted according to each sub-matrix and the variable node update procedure is repeatedly performed.

The procedure for performing the partial parallel process on all variable node processes based on the prototype parity check matrix increases the decoding speed or decreases complexity. However, as shown in FIGS. 7A, 7B, 8A and 8B, since the size of the sub-matrix is extended in the partial parallel process using the prototype parity check matrix, the process becomes complicated and the decoding process speed decreases.

Accordingly, when parity check matrixes where the size of the sub-matrix is extended or reduced according to or similarly to the format of FIGS. 5 and 6 are realized in one decoding apparatus, a method for decoding the partial parallel process using the prototype parity check matrix individually according to the sub-matrix size will be described. Also, compared with the partial parallel processing method using the prototype parity check matrix shown in FIG. 5, a method for increasing the decoding speed according to a twice-extended parallelization size will be described.

Figure 9:
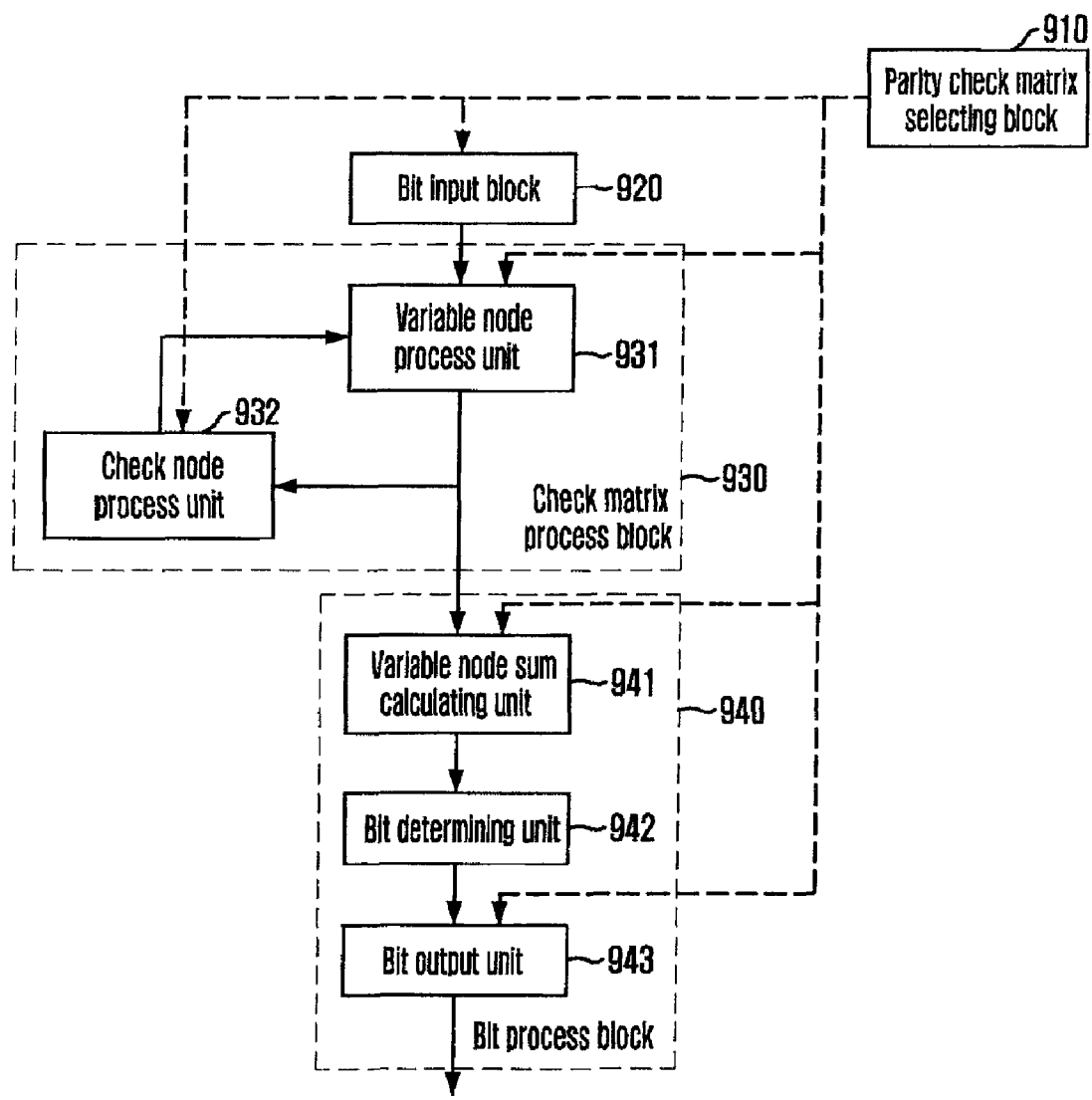
FIG. 9 shows an apparatus for decoding an LDPC code using multiple prototype parity check matrixes in accordance with an embodiment of the present invention.

FIG. 9 shows an apparatus for decoding an LDPC code using multiple prototype parity check matrixes in accordance with an embodiment of the present invention.

Referring to FIG. 9, the apparatus for decoding the LDPC code in accordance with the present invention includes a parity check matrix selecting block 910, a bit input block 920, a check matrix process block 930 and a bit process block 940. The check matrix process block 930 includes a variable node process unit 931 and a check node process unit 932. The bit process block 940 includes a variable node sum calculating unit 941, a bit determining unit 942 and a bit output unit 943.

The parity check matrix selecting block 910 determines multiple prototype parity check matrixes according to the sub-matrix size and the parallelization figure for processing the parity check matrix. The multiple prototype parity check matrixes determined in the parity check matrix selecting block 910 are extensively applied to transformation of the sub-matrix size and the parallelization figure. The parity check matrix selecting block 910 determines multiple prototype parity check matrixes according to the length and the bit rate of diverse code words and transmits the parallelization figure and sub-matrix size information on the length and the bit rate of diverse code words to the bit input block 920, the check matrix process block 930 and the bit process block 940.

The bit input block 920 receives a log likelihood probability value for an input bit according to the multiple prototype parity check matrixes determined in the parity check matrix selecting block 910.

The check matrix process block 930 sequentially performs the partial parallel process on the parity check matrix to be processed based on the log likelihood probability value received in the bit input block 920 and the multiple prototype parity check matrixes. The prototype parity check matrix means a parity check matrix related to one row among the parity check matrixes according to the sub-matrix.

The bit process block 940 determines a bit level based on the parity check matrix value on which the partial parallel process is performed in the check matrix process block 930, recovers the input bit according to the parallelization figure, and outputs the recovered bit.

Each of constituent elements of the apparatus for decoding the LDPC code in accordance with the present invention will be described in detail.

The parity check matrix selecting block 910 determines the multiple prototype parity check matrixes according to the parallelization figure for processing the parity check matrix.

The bit input block 920 sequentially receives the LLR value for input bit from the LDPC coding apparatus according to the determined multiple prototype parity check matrixes and transmits the received LLR value for input bit to the variable node process unit 931 within a given time. The procedure for transmitting the LLR value can be performed differently according to the parity check matrix. Also, the bit input block 920 can respectively receive different log likelihood probability values for input bit.

The variable node process unit 931 calculates a variable node message by summating the LLR value and the variable node value transmitted from the bit input block 920. The variable node process unit 931 summates the LLR value and the variable node value according to the multiple prototype parity check matrixes and transmits the calculated variable node message to the check node process unit 932. Also, the variable node process unit 931 receives a check node message from the check node process unit 932. That is, the variable node process unit 931 updates the variable node through the message exchange procedure.

The check node process unit 932 calculates the check node message by applying the variable node message transmitted from the variable node process unit 931 to the check node operation procedure. The check node process unit 932 may adopt the entire parallel processing method to increase the decoding speed, or the serial or partial parallel processing method to decrease decoding complexity. The check node process unit 932 transmits the calculated check node message to the variable node process unit 931.

The variable node process unit 931 cyclic-shifts the LLR value and the variable node value according to the sub-matrix based on the sub-matrix size and the parallelization figure and sequentially performs the partial parallel process on the parity check matrix. The variable node process unit 931 repeatedly performs the procedure of summating the cyclic-shifted variable node value and LLR value. The variable node process unit 931 updates variable nodes required for calculating the variable node message based on the check node message transmitted from the check node process unit 932. Subsequently, the variable node process unit 931 calculates the variable node message based on the updated variable node value.

Meanwhile, the variable node process unit 931 respectively calculates the variable node message by cyclic-shifting the log likelihood probability value received in the bit input block 920 and the variable nodes of the different prototype parity check matrixes according to the sub-matrix based on the sub-matrix size and the parallelization figure. Subsequently, the variable node process unit 931 can simultaneously process the input of two different code words. Also, when the variable node process unit 931 cyclic-shifts the received log likelihood probability value and the variable nodes of the different prototype parity check matrixes, cyclic shift connection of the log likelihood probability value and the variable nodes is changed through simple switching. The different parity check matrixes have a cyclic shift value of each sub-matrix where rest values divided by the sub-matrix size correspond.

Subsequently, the variable node sum calculating unit 941 performs the LDPC decoding procedure according to the multiple prototype parity check matrixes repeatedly as many as the predetermined number or as user's desire in the variable node process unit 931 and the check node process unit 932, calculates the variable node sum of the LLR value and the edge value of each variable node, and transmits the result to the bit determining unit 942. Subsequently, the bit determining unit 942 determines a bit level corresponding to the variable node sum calculated in the variable node sum calculating unit 941 as "0" or "1" and recovers an input bit.

The bit output unit 943 receives the input bit recovered in the bit determining unit 942 at a given time and sequentially outputs the recovered input bit according to the parallelization figure and the sub-matrix size on the multiple prototype parity check matrixes. The bit output procedure can be outputted according to the parity check matrix according to diverse methods.

Figure 10A:
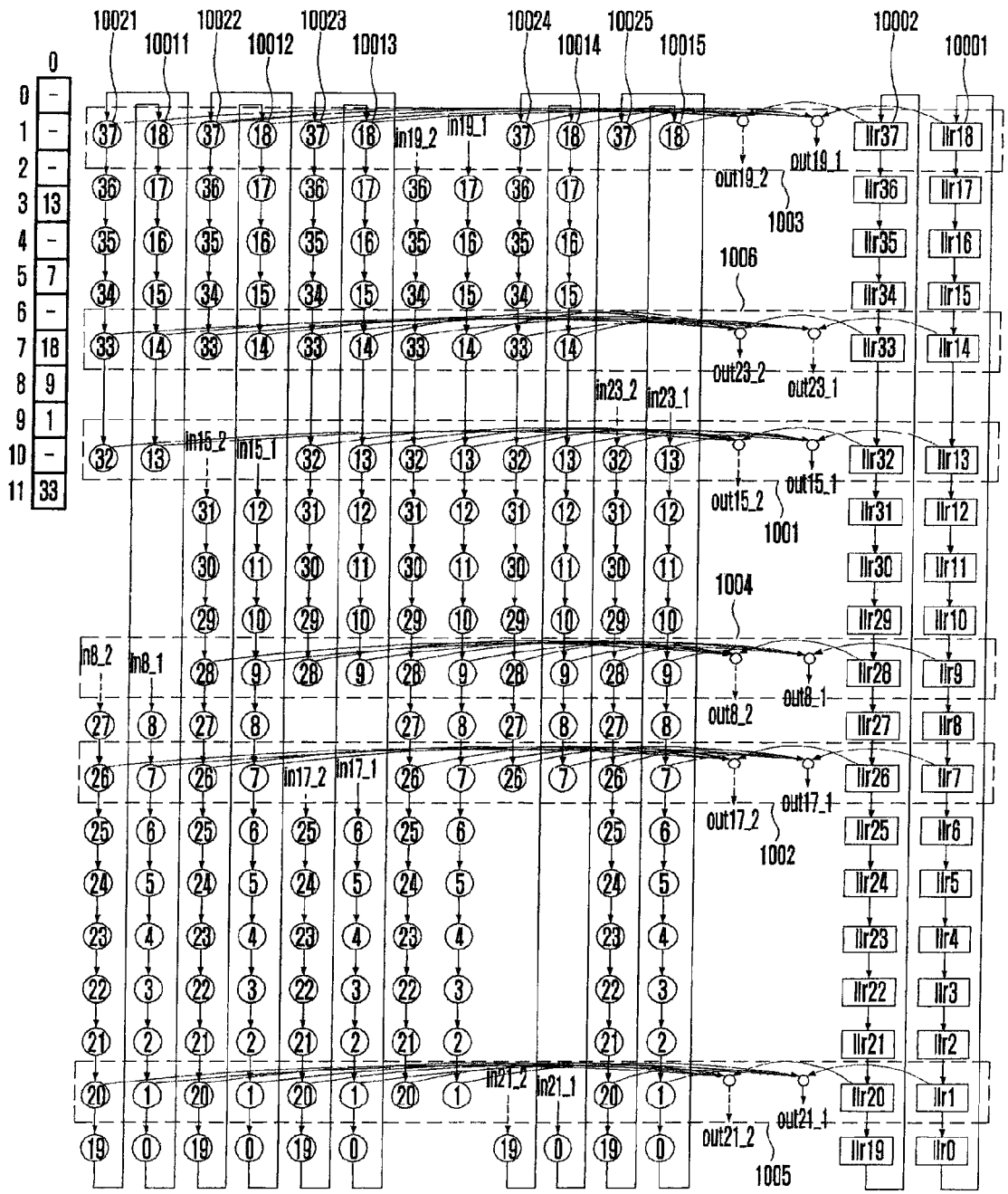
FIGS. 10A and 10B show a method for performing the partial parallel process on the parity check matrix of FIG. 5 based on the multiple prototype parity check matrixes in accordance with an embodiment of the present invention.
Figure 10B:
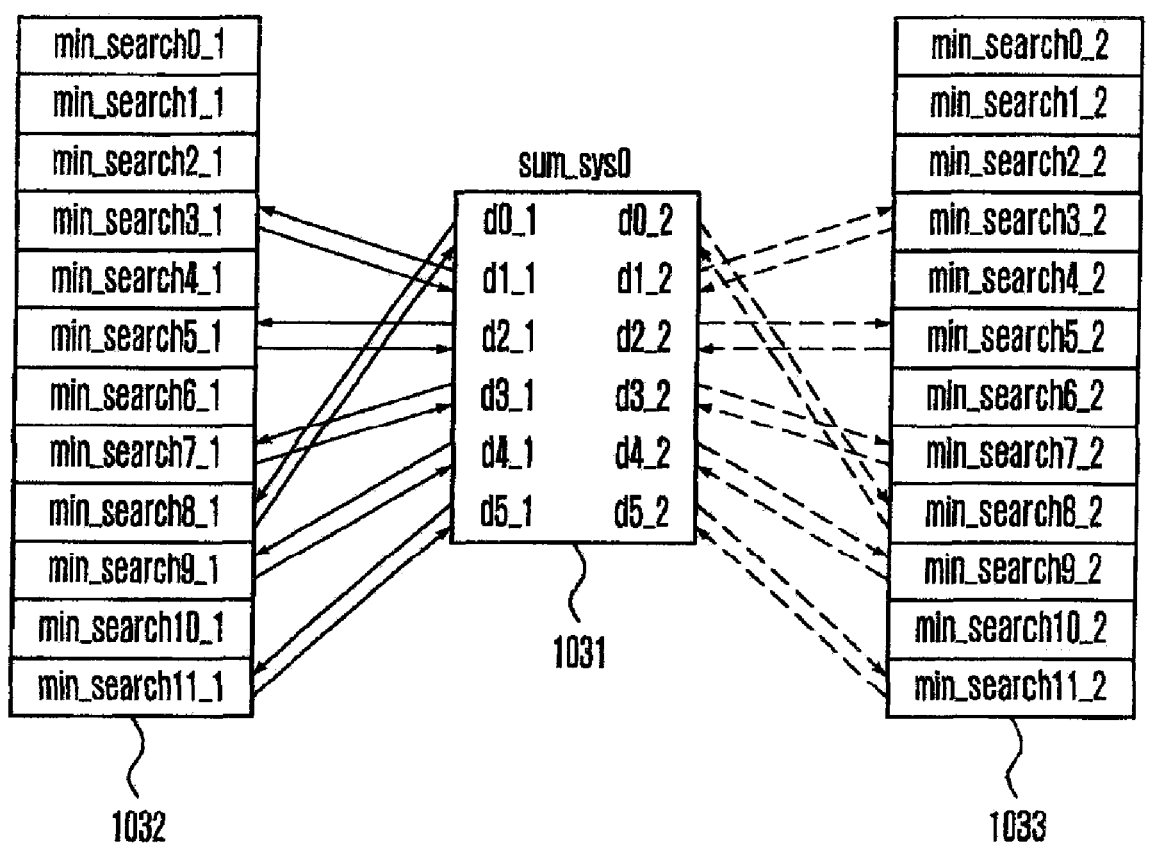

FIGS. 10A and 10B show a method for performing the partial parallel process on the parity check matrix of FIG. 5 based on the multiple prototype parity check matrixes in accordance with an embodiment of the present invention. FIGS. 10A and 10B show partial parallel processes 1001 to 1006 of the parity check matrix based on transformation of the sub-matrix size with respect to the first column 51 of the parity check matrix shown in FIG. 5.

The variable node process unit 931 calculates the variable node message by summating LLR values 10001 and 10002, and variable nodes 10011 to 10015 and 10021 to 10025 for each variable node corresponding to the first column 51 of the parity check matrix. For example, the variable node process unit 931 calculates a variable node message out19_1 by summating a first LLR value 10001 and the variable nodes 10011 to 10015 with respect to an 18 times cyclic-shifted sub-matrix corresponding to a $7^{th}$ row of the first column 51 of the parity check matrix shown in FIG. 5, and calculates a variable node message out19_2 by summating a second LLR value 10002 and the variable nodes 10021 to 10025.

In the same manner, the variable node process unit 931 calculates variable node messages out19_1, out19_2, out23_1, out23_2, out15_2, out15_1, out8_1, out8_2, out17_1, out17_2, out21_1 and out21_2 through first and second variable node processes 1001 to 1006 corresponding to each sub-matrix value of the parity check matrix. Subsequently, the variable node process unit 931 cyclic-shifts the LLR values 10001 and 10002, and the variable node values 10011 to 10015 and 10021 to 10025 according to the sub-matrix.

As shown in FIG. 10B, the variable node process unit 931 transmits the calculated variable node messages from a variable node 1031 to check nodes 1032 and 1033, respectively, to increase the process speed of the variable node twice.

Figure 11A:
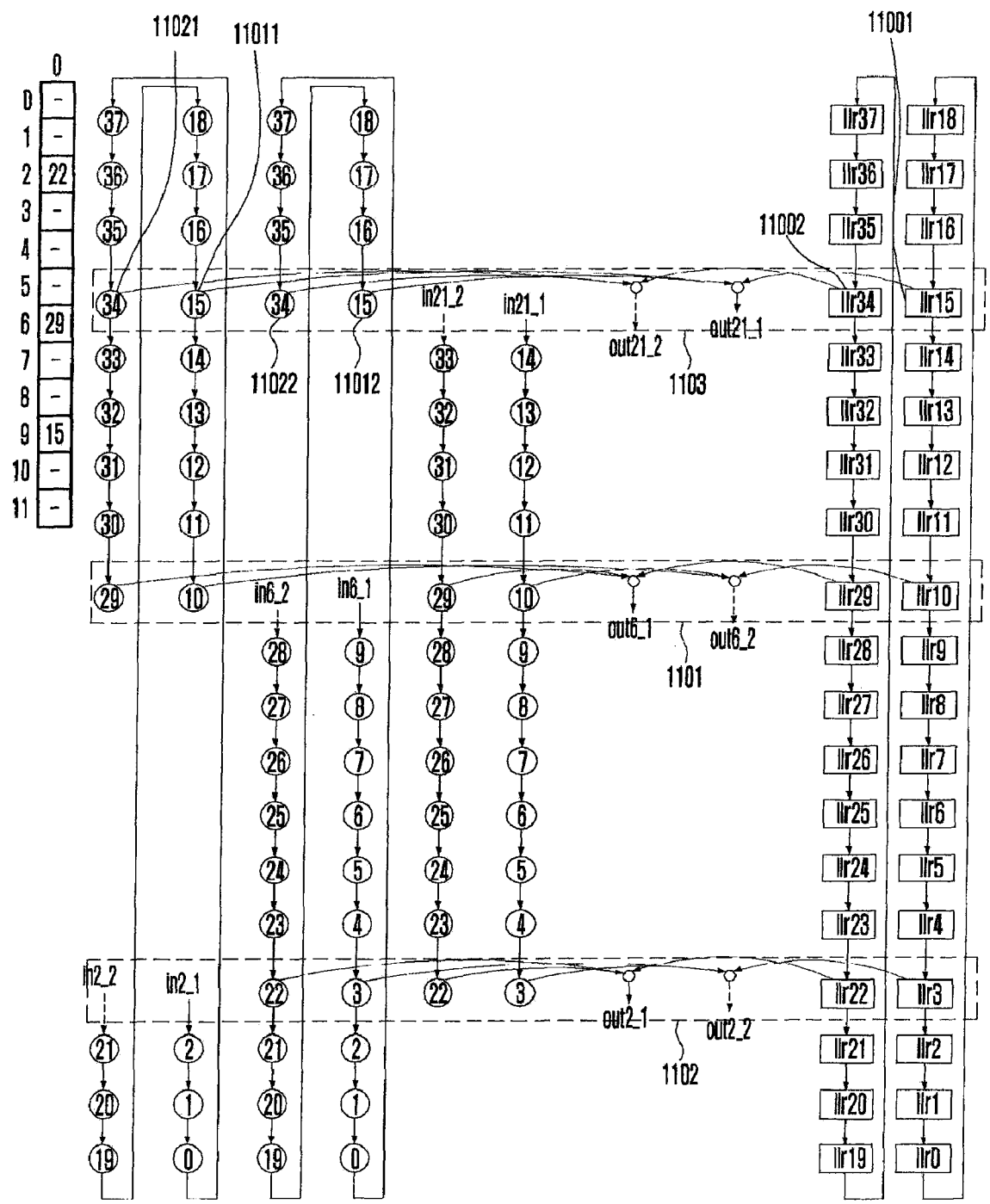
FIGS. 11A and 11B show a method for performing the partial parallel process on the parity check matrix of FIG. 5 based on the multiple prototype parity check matrixes in accordance with another embodiment of the present invention.
Figure 11B:
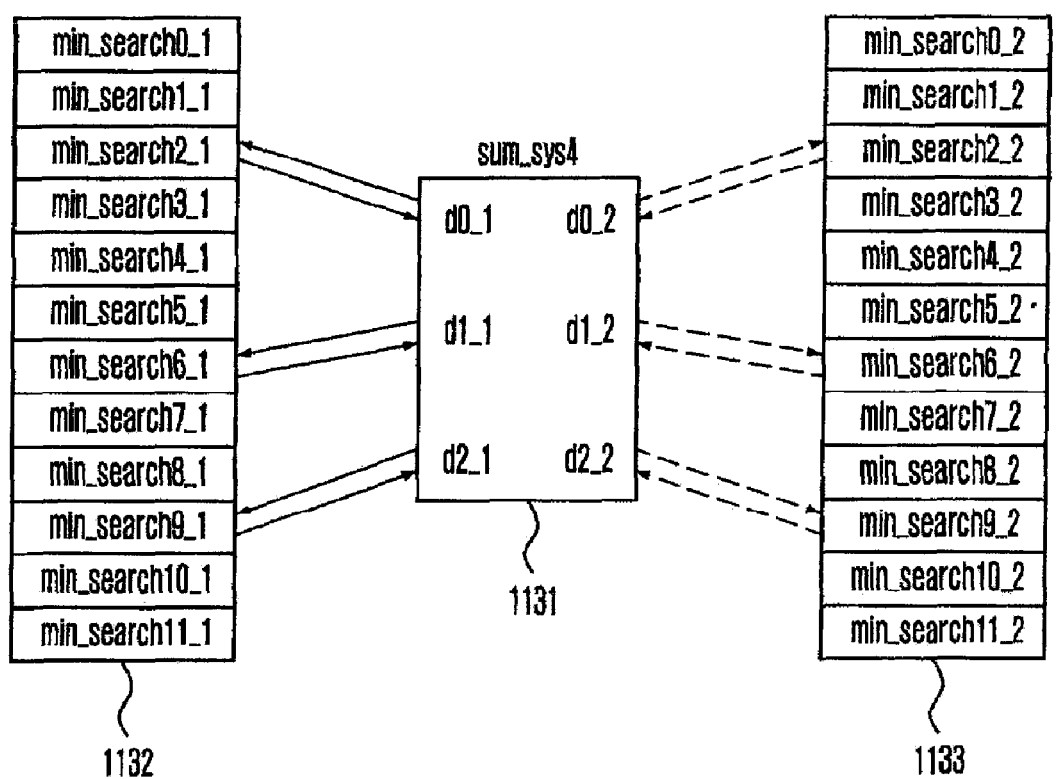

FIGS. 11A and 11B show a method for performing the partial parallel process on the parity check matrix of FIG. 5 based on the multiple prototype parity check matrixes in accordance with another embodiment of the present invention. FIGS. 11A and 11B show partial parallel processes 1101 to 1103 on the parity check matrix based on the prototype parity check matrix with respect to the fourth column 52 of the parity check matrix shown in FIG. 5.

The variable node process unit 931 calculates a variable node message by summating LLR values 11001 and 11002, and the values of variable nodes 11011 and 11012, and 11021 and 11022 for each variable node corresponding to the fourth column 52 of the parity check matrix. For example, the variable node process unit 931 calculates a variable node message out21_1 by summating a first LLR value 11001 and the values of the variable nodes 11011 and 11012 with respect to 15 times cyclic-shifted sub-matrix corresponding to a $9^{th}$ row of the fourth column 52 of the parity check matrix shown in FIG. 5, and calculates a variable node message out21_2 by summating a second LLR value 11002 and the values of the variable nodes 11021 and 11022.

In the same manner, the variable node process unit 931 calculates variable node messages out21_1, out21_2, out6_1, out6_2, out2_1, and out2_2 through variable node message operation procedures 1101 to 1103 corresponding to each sub-matrix value of the parity check matrix. Subsequently, the variable node process unit 931 cyclic-shifts the LLR values 11001 and 11002, and the values of the variable nodes 11011, 11012, 11021 and 11022 according to the sub-matrix.

As shown in FIG. 11B, the variable node process unit 931 transmits the calculated variable node message from a variable node 1131 to check nodes 1132 and 1133, respectively.

In the partial process of the parity check matrix shown in FIGS. 10A, 10B, 11A and 11B, compared with the process of FIGS. 8 and 9, the variable node process unit 931 creates two variable node messages through different parity check matrix processes. Accordingly, connection between the variable node and the check node becomes complicated twice but a convergence speed increases twice.

Figure 12A:
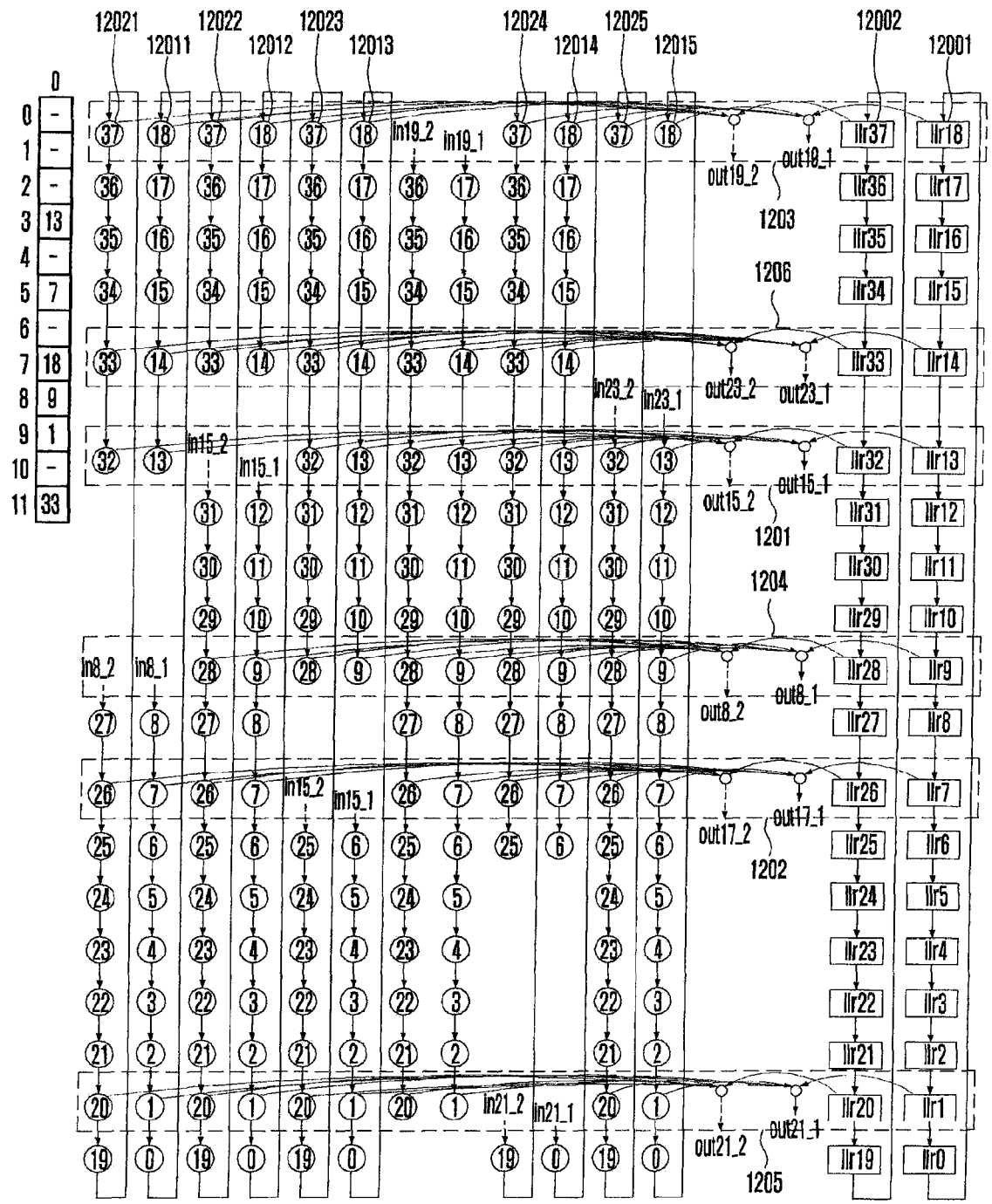
FIGS. 12A and 12B show a method for performing the partial parallel process on the parity check matrix of FIG. 6 based on the multiple prototype parity check matrixes in accordance with another embodiment of the present invention.
Figure 12B:
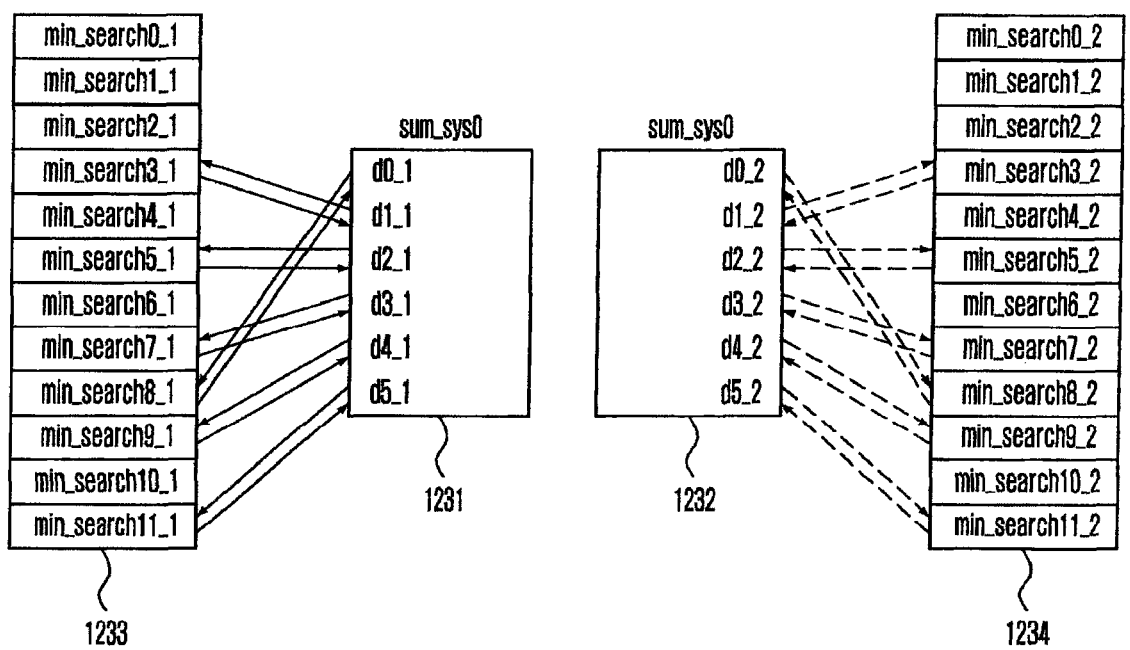

FIGS. 12A and 12B show a method for performing the partial parallel process on the parity check matrix of FIG. 6 based on the multiple prototype parity check matrixes in accordance with another embodiment of the present invention.

FIGS. 12A and 12B show partial parallel processes 1201 to 1206 for transformation of the parallelization figure with respect to the first column 61 of the parity check matrix shown in FIG. 6.

With respect to the $7^{th}$ row of the first column 51 of the parity check matrix, the variable node process unit 931 cyclic-shifts the LLR values 10001 and 10002, and the variable node values 10011 to 10015 and 10021 to 10025 in an order of 0 to 37 according to each 38×38 sub-matrix in the cyclic shift method shown in FIGS. 10A and 10B.

To have a look at the changed cyclic shift method, the variable node process unit 931 changes the cyclic shift method according to the parallelization figure selected in the parity check matrix selecting block 910. That is, the variable node process unit 931 cyclic-shifts each of the LLR values 12001 and 12002, and each of the variable node values 12011 to 12015 and 12021 to 12025 in an order of 0 to 19 according to a 19×19 sub-matrix in the cyclic shift shown in FIGS. 12A and 12B.

For example, the variable node process unit 931 calculates a variable node message out19_1 by summating a first LLR value 12001 and variable nodes 12011 to 12015 with respect to the 18 times cyclic-shifted sub-matrix corresponding to the $7^{th}$ row of the first column 61 of the parity check matrix shown in FIG. 6, and calculates a variable node message out19_2 by summating a second LLR value 12002 and the variable nodes 12021 to 12025. In the same manner, the variable node process unit 931 calculates variable node messages out19_1, out19_2, out23_1, out23_2, out15_2, out15_1, out8_1, out8_2, out17_1, out17_2, out21_1 and out21_2 through the first and second variable node processes 1201 to 1206 corresponding to each sub-matrix value of the parity check matrix.

Subsequently, the variable node process unit 931 cyclic-shifts the LLR values 12001 and 12002, and the values of the variable nodes 12011 to 12015 and 12021 to 12025 according to each 19×19 sub-matrix with respect to the parity check matrix dividing the 38×38 sub-matrix into the 19×19 sub-matrix.

Referring to FIG. 12B, the variable node process unit 931 transmits the calculated variable node message from variable nodes 1231 and 1232 to different check nodes 1233 and 1234, respectively.

Figure 13A:
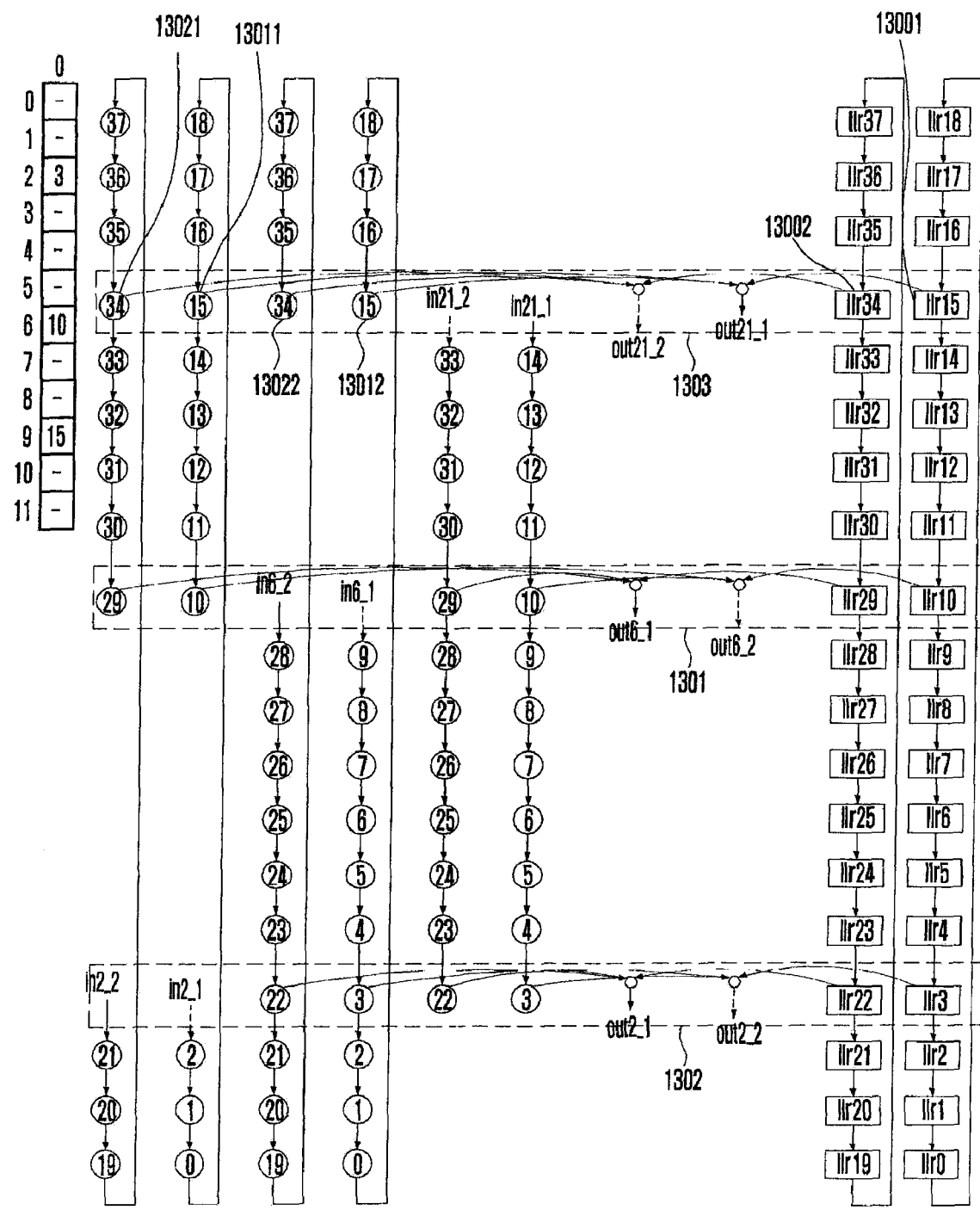
FIGS. 13A and 13B show a method for performing the partial parallel process on the parity check matrix of FIG. 6 based on the multiple prototype parity check matrixes in accordance with another embodiment of the present invention.
Figure 13B:
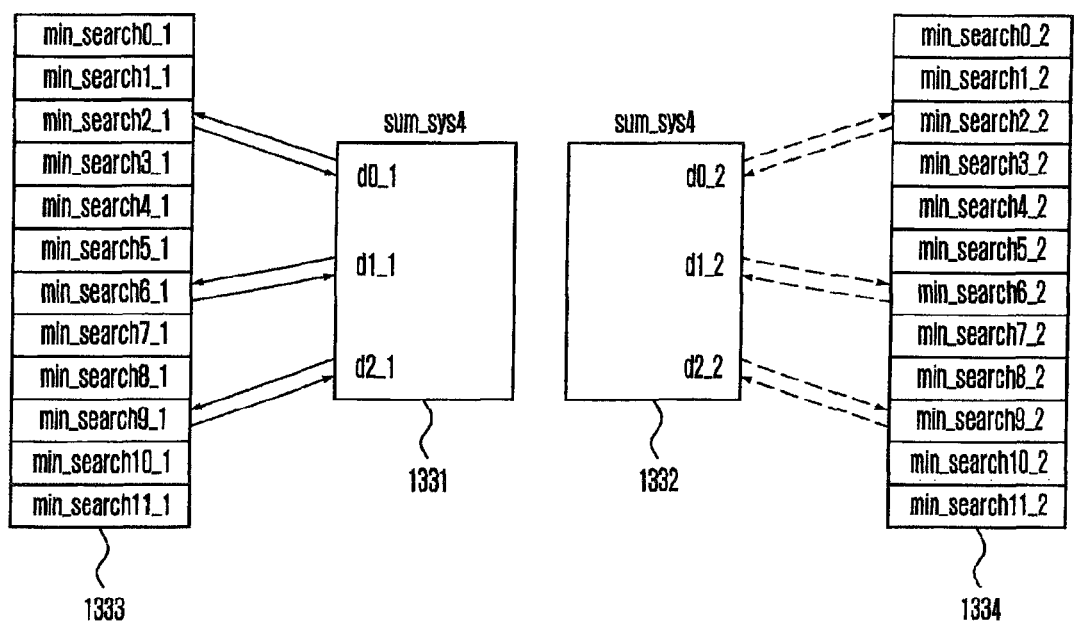

FIGS. 13A and 13B show a method for performing the partial parallel process on the parity check matrix of FIG. 6 based on the multiple prototype parity check matrixes in accordance with another embodiment of the present invention.

FIGS. 13A and 13B show partial parallel processes 1301 to 1303 on the parity check matrix based on the prototype parity check matrix with respect to the fourth column 62 of the parity check matrix shown in FIG. 6.

As described above, the variable node process unit 931 cyclic-shifts the LLR values 11001 and 11002, and the variable node values 11011, 11012, 11021, and 11022 in an order of 0 to 37 according to the 38×38 sub-matrix in the cyclic shift method shown in FIGS. 11A and 11B, with respect to the $9^{th}$ row of the fourth column 52 of the parity check matrix.

To have a look at the changed cyclic shift method, the variable node process unit 931 changes the cyclic shift method according to the parallelization figure selected in the parity check matrix selecting block 910. That is, the variable node process unit 931 cyclic-shifts each of the LLR values 13001 and 13002, and each of the variable node values 13011, 13012, 13021 and 13022 in an order of 0 to 19 according to the 19×19 sub-matrix in the cyclic shift method shown in FIGS. 13A and 13B.

The variable node process unit 931 calculates the variable node message by summating the LLR values 13001 and 13002, and the values of the variable nodes 13011, 13012, 13021, and 13022 for each variable node corresponding to the fourth column 62 of the parity check matrix. For example, the variable node process unit 931 calculates a variable node message out21_1 by summating a first LLR value 13001 and the values of the variable nodes 13011 and 13012 with respect to the 15 times cyclic-shifted sub-matrix corresponding to the $9^{th}$ row of the fourth column 52 of the parity check matrix shown in FIG. 6, and calculates a variable node message out21_2 by summating a second LLR value 13002 and the values of the variable nodes 13021 and 13022.

In the same manner, the variable node process unit 931 calculates variable node messages out21_1, out21_2, out6_1, out6_2, out2_1, and out2_2 through variable node message operation procedures 1301 to 1303 corresponding to each sub-matrix value of the parity check matrix. Subsequently, the variable node process unit 931 cyclic-shifts the LLR values 13001 and 13002, and the values of the variable nodes 13011, 13012, 13021, and 13022, respectively according to the 19×19 sub-matrix, with respect to the parity check matrix where the 38×38 sub-matrix are divided into two 19×19 sub-matrixes according to the changed cyclic shift method.

As shown in FIG. 13B, the variable node process unit 931 transmits the calculated variable node message from variable nodes 1331 and 1332 to other check nodes 1333 and 1334, respectively.

Figure 14:
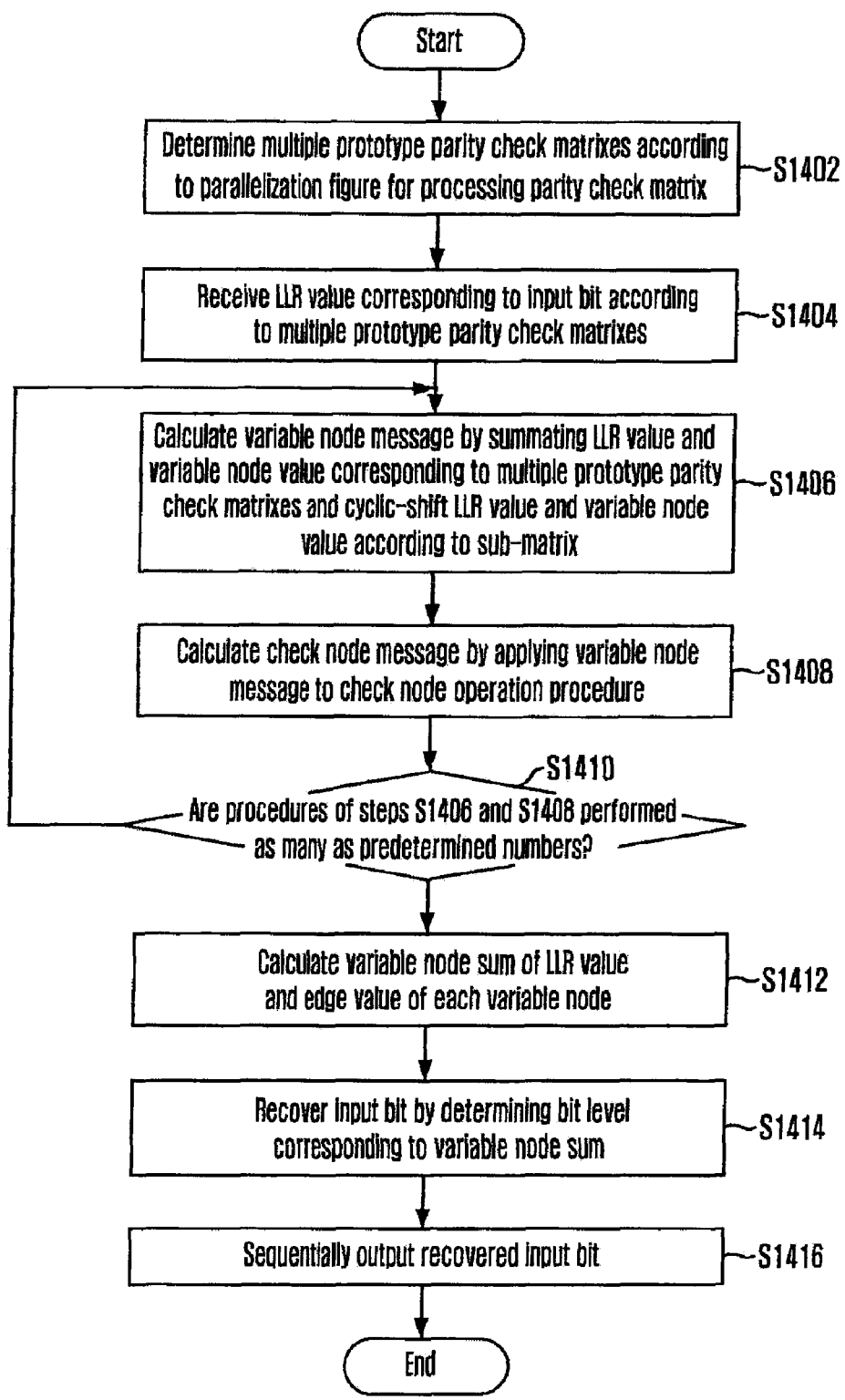
FIG. 14 is a flowchart describing a method for decoding an LDPC code based on the multiple prototype matrix in accordance with an embodiment of the present invention.

FIG. 14 is a flowchart describing a method for decoding the LDPC code based on the multiple prototype matrix in accordance with an embodiment of the present invention.

At step S1402, the parity check matrix selecting block 910 determines multiple prototype parity check matrixes according to the parallelization figure for processing the parity check matrix.

At step S1404, the bit input block 920 sequentially receives an LLR value corresponding to an input bit from the LDPC coding apparatus according to the multiple prototype parity check matrixes.

At step S1406, the variable node process unit 931 calculates a variable node message by performing a variable node operation on the LLR value and the variable node value corresponding to the multiple prototype parity check matrixes in the bit input block 920, and cyclic-shifts the completely operated LLR value and the variable node value according to the sub-matrix at each process time. That is, the variable node process unit 931 performs a variable node update procedure.

At step S1408, the check node process unit 932 calculates a check node message by applying the variable node message calculated in the variable node process unit 931 to the check node operation procedure. At this time, the check node process unit 932 may adopt a parallel processing method to increase a decoding speed, or a serial or partial parallel processing method to decrease decoding complexity. That is, the check node process unit 932 performs the check node update procedure.

At step S1410, the variable node process unit 931 checks whether the procedures of the steps S1406 and S1408 are performed as many as predetermined numbers.

When it turns out at step S1410 that the procedures of the steps S1406 and S1408 are performed as many as predetermined numbers, the variable node sum calculating unit 941 calculates the variable node sum of the LLR value and the edge value of each variable node at step S1412. Otherwise, the procedures of the steps S1406 and S1408 are performed again.

At step S1414, the bit determining unit 942 recovers the input bit by determining the bit level corresponding to the variable node sum calculated in the variable node sum calculating unit 941 as "0" or "1".

At step S1416, the bit output unit 943 sequentially outputs the input bit recovered as "0" or "1" in the bit determining unit 942. The bit output procedure may be outputted based on the multiple prototype parity check matrixes according to diverse methods.

As described above, the technology of the present invention can be realized as a program. A code and a code segment forming the program can be easily inferred from a computer programmer of the related field. Also, the realized program is stored in a computer-readable recording medium, i.e., information storing media, and is read and operated by the computer, to thereby realize the method of the present invention. The recording medium includes all types of recording media which can be read by the computer.

As described above, in decoding the input bit based on the parity check matrix, the present invention sequentially performs the partial parallel process on the parity check matrix based on the multiple prototype parity check matrixes determined according to the parallelization figure, to thereby decrease complexity and perform the decoding process at high-speed.

The present invention can support the length and bit rate of diverse code words by extensively applying the procedure for sequentially performing the partial parallel process on the parity check matrix based on the prototype parity check matrix to the sub-matrix size transformation and the parallelization figure transformation. Furthermore, the present invention can maintain the same decoding speed with no regard to the length of the code word and raise efficiency by using entire hardware resources.

Also, the present invention can simply and simultaneously process the input of different code words by changing cyclic shift connection of the input LLR and the variable node according to the transformation of the sub-matrix size and parallelization figure.

While the present invention has been described with respect to the specific embodiments, it will be apparent to those skilled in the art that various changes and modifications may be made without departing from the spirit and scope of the invention as defined in the following claims.

What is claimed is:

1. An apparatus for decoding a Low Density Parity Check (LDPC) code, comprising:
    a parity check matrix selecting means for determining multiple prototype parity check matrixes according to a sub-matrix size and a parallelization figure for processing the parity check matrix;
    a bit input means for receiving a log likelihood probability value for input bit according to the sub-matrix size and the parallelization figure;
    a check matrix process means for sequentially performing a partial parallel process on the parity check matrix based on the received log likelihood probability value and the determined multiple prototype parity check matrixes; and
    a bit process means for determining a bit level based on the partial-parallel processed parity check matrix value and recovering the input bit according to the sub-matrix size and the parallelization figure.

2. The apparatus of claim 1, wherein the check matrix process means cyclic-shifts the received log likelihood probability value and the variable nodes of the determined multiple prototype parity check matrixes according to the sub-matrix size and the parallelization figure.

3. The apparatus of claim 2, wherein the check matrix process means includes:
    a variable node process unit for performing cyclic-shift on the received log likelihood probability value and the variable nodes of the determined multiple prototype parity check matrixes according to each sub-matrix according to the sub-matrix size and the parallelization figure and calculating a variable node message; and
    a check node process unit for calculating a check node message according to the sub-matrix through a check node operation procedure and transmitting the calculated variable node message to the variable node process unit.

4. The apparatus of claim 3, wherein the bit input means respectively receives the log likelihood probability values for different input bits.

5. The apparatus of claim 4, wherein the variable node process unit cyclic-shifts the received log likelihood probability value and the variable nodes of different prototype parity check matrixes according to the sub-matrix based on the sub-matrix size and the parallelization figure and respectively calculating the variable node messages.

6. The apparatus of claim 5, wherein the variable node process unit cyclic-shifts the received log likelihood probability value and the variable nodes of different prototype parity check matrixes, and changes cyclic shift connection of the log likelihood probability value and the variable nodes through switching.

7. The apparatus of claim 6, wherein the different prototype parity check matrixes have a cyclic shift value of a sub-matrix corresponding to a rest value divided by the determined sub-matrix size.

8. The apparatus of claim 3, wherein the bit process means includes:
    a variable node sum calculating unit for calculating the variable node sum of the edge value of each variable node of the partial-parallel-processed parity check matrix and the received log likelihood probability value;
    a bit determining unit for recovering the input bit by determining a bit level corresponding to the calculated variable node sum; and
    a bit output unit for outputting the recovered input bit.

9. A method for decoding a Low Density Parity Check (LDPC) code using a decoder, comprising:
    determining multiple prototype parity check matrixes according to a sub-matrix size and a parallelization figure for processing a parity check matrix;
    receiving a log likelihood probability value on an input bit according to the sub-matrix size and the parallelization figure;
    sequentially performing a partial parallel process on the parity check matrix based on the received log likelihood probability value and the determined multiple prototype parity check matrixes; and
    recovering the input bit according to the sub-matrix size and the parallelization figure by determining a bit level based on the partial-parallel-processed parity check matrix value.

10. The method of claim 9, wherein the received log likelihood probability value and the variable nodes of the determined multiple prototype parity check matrixes are cyclic-shifted according to the sub-matrix size and the parallelization figure.

11. The method of claim 10, wherein said sequentially performing a partial parallel process includes:
    calculating a variable node message by cyclic-shifting the received log likelihood probability value and the variable nodes of the determined multiple prototype parity check matrixes according to the sub-matrix based on the sub-matrix size and the parallelization figure; and
    calculating a check node message through a check node operation procedure of the calculated variable node message according to the sub-matrix.

12. The method of claim 11, wherein the log likelihood probability values for different input bits are respectively received.

13. The method of claim 12, wherein the variable node messages are respectively calculated by cyclic-shifting the received log likelihood probability value and the variable nodes of the different prototype parity check matrixes according to the sub-matrix based on the sub-matrix size and the parallelization figure.

14. The method of claim 13, wherein when the received log likelihood probability value and the variable nodes of the different prototype parity check matrixes are cyclic-shifted, cyclic shift connection of the log likelihood probability value and the variable nodes is changed through switching.

15. The method of claim 14, wherein the different prototype parity check matrixes have a cyclic shift value of a sub-matrix where rest values acquired after dividing by a predetermined sub-matrix size correspond.

16. The method of claim 11, wherein said recovering the input bit includes:
    calculating variable node sum of the edge value of each variable node of the partial-parallel-processed parity check matrix and the received log likelihood probability value; and
    recovering the input bit by determining a bit level corresponding to the calculated variable node sum.

* * * * *